United States Patent
Byun et al.

(10) Patent No.: US 12,253,650 B2
(45) Date of Patent: Mar. 18, 2025

(54) ANTI-REFLECTIVE FILM

(71) Applicant: LG CHEM, LTD., Seoul (KR)

(72) Inventors: Jinseok Byun, Daejeon (KR); Kyung Moon Ko, Daejeon (KR); Yeongrae Chang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 414 days.

(21) Appl. No.: 17/771,214

(22) PCT Filed: Mar. 16, 2021

(86) PCT No.: PCT/KR2021/003226
§ 371 (c)(1),
(2) Date: Apr. 22, 2022

(87) PCT Pub. No.: WO2021/187859
PCT Pub. Date: Sep. 23, 2021

(65) Prior Publication Data
US 2023/0003921 A1  Jan. 5, 2023

(30) Foreign Application Priority Data

Mar. 16, 2020 (KR) .................. 10-2020-0032251
Mar. 16, 2020 (KR) .................. 10-2020-0032253
(Continued)

(51) Int. Cl.
*G02B 1/14* (2015.01)
*G02B 1/111* (2015.01)
(Continued)

(52) U.S. Cl.
CPC ............. *G02B 1/115* (2013.01); *G02B 1/111* (2013.01); *G02B 1/14* (2015.01); *H10K 50/865* (2023.02);
(Continued)

(58) Field of Classification Search
None
See application file for complete search history.

(56) References Cited

U.S. PATENT DOCUMENTS

2007/0048509 A1  3/2007  Yoneyama et al.
2010/0254003 A1  10/2010  Higashikawa et al.
(Continued)

FOREIGN PATENT DOCUMENTS

CN  107110996 A  8/2017
CN  107360718 A  11/2017
(Continued)

OTHER PUBLICATIONS

International Search Report issued for International Application No. PCT/KR2021/003226 on Jul. 7, 2021, 4 pages.
(Continued)

*Primary Examiner* — Derek S. Chapel
(74) *Attorney, Agent, or Firm* — ROTHWELL, FIGG, ERNST & MANBECK, P.C.

(57) ABSTRACT

The present disclosure relates to an anti-reflective film comprising: a hard coating layer; and a low refractive index layer, wherein a particle-mixed layer containing both hollow inorganic nanoparticles and solid inorganic nanoparticles and having a thickness of 1.5 nm to 22 nm exists in the low refractive index layer, and wherein the anti-reflective film has a ratio of the reflectance at a wavelength of 400 nm to the reflectance at a wavelength of 550 nm of 1.3 to 2.7, and a polarizing plate, a display device, and an organic light emitting diode display device comprising the anti-reflective film.

19 Claims, 10 Drawing Sheets

(30) Foreign Application Priority Data

Mar. 16, 2021 (KR) ........................ 10-2021-0033696
Mar. 16, 2021 (KR) ........................ 10-2021-0033702

(51) Int. Cl.
*G02B 1/115* (2015.01)
*H10K 50/86* (2023.01)
*G02B 5/02* (2006.01)
*H10K 102/00* (2023.01)

(52) U.S. Cl.
CPC ...... *G02B 5/0242* (2013.01); *H10K 2102/331* (2023.02)

(56) References Cited

U.S. PATENT DOCUMENTS

| | | |
|---|---|---|
| 2011/0164209 A1 | 7/2011 | Yoshihara et al. |
| 2012/0200933 A1 | 8/2012 | Akiyama et al. |
| 2013/0215514 A1 | 8/2013 | Kim et al. |
| 2013/0216729 A1 | 8/2013 | Kim et al. |
| 2013/0216817 A1 | 8/2013 | Kim et al. |
| 2013/0216819 A1 | 8/2013 | Kim et al. |
| 2013/0222915 A1 | 8/2013 | Kim et al. |
| 2015/0301231 A1 | 10/2015 | Yang et al. |
| 2015/0323706 A1 | 11/2015 | Yang et al. |
| 2018/0017713 A1 | 1/2018 | Byun et al. |
| 2018/0088254 A1 | 3/2018 | Kim et al. |
| 2018/0231688 A1 | 8/2018 | Byun et al. |
| 2019/0004214 A1 | 1/2019 | Kim et al. |
| 2019/0113658 A1 | 4/2019 | Byun et al. |
| 2019/0170907 A1 | 6/2019 | Byun et al. |
| 2020/0142100 A1 | 5/2020 | Kim et al. |
| 2020/0217991 A1 | 7/2020 | Byun et al. |
| 2020/0241173 A1 | 7/2020 | Byun et al. |
| 2020/0278479 A1 | 9/2020 | Byun et al. |
| 2020/0333509 A1 | 10/2020 | Kim et al. |
| 2022/0091303 A1* | 3/2022 | Kozakai ................ G02B 5/3025 |
| 2022/0381954 A1* | 12/2022 | Byun ..................... G02B 1/115 |
| 2023/0003921 A1 | 1/2023 | Byun et al. |

FOREIGN PATENT DOCUMENTS

| | | |
|---|---|---|
| CN | 107632330 A | 1/2018 |
| CN | 107635765 A | 1/2018 |
| EP | 3415959 A1 | 12/2018 |
| JP | 2007-121993 A | 5/2007 |
| JP | 2007-301970 A | 11/2007 |
| JP | 2008-310119 A | 12/2008 |
| JP | 2011-088787 A | 5/2011 |
| JP | 2011-102977 A | 5/2011 |
| JP | 2011-123513 A | 6/2011 |
| JP | 2012-036394 A | 2/2012 |
| JP | 2018-533068 A | 11/2018 |
| JP | 2019-028364 A | 2/2019 |
| JP | 2019-034422 A | 3/2019 |
| JP | 2019-035991 A | 3/2019 |
| JP | 2019-508753 A | 3/2019 |
| JP | 2019-517029 A | 6/2019 |
| KR | 10-2012-0093212 A | 8/2012 |
| KR | 10-1189196 B1 | 10/2012 |
| KR | 10-2014-0065250 A | 5/2014 |
| KR | 10-1526650 B1 | 6/2015 |
| KR | 10-2016-0019367 A | 2/2016 |
| KR | 10-2016-0112053 A | 9/2016 |
| KR | 10-2017-0021757 A | 2/2017 |
| KR | 10-2018-0043687 A | 4/2018 |
| KR | 10-2018-0113483 A | 10/2018 |
| KR | 10-2019-0043516 A | 4/2019 |
| KR | 10-2019-0067756 A | 6/2019 |
| KR | 10-2019-0108969 A | 9/2019 |
| WO | 2019-107036 A1 | 6/2019 |
| WO | 2019221573 A1 | 11/2019 |
| WO | 2021-187861 A1 | 9/2021 |

OTHER PUBLICATIONS

International Search Report issued for International Application No. PCT/KR2021/003228 on Jul. 8, 2021, 4 pages.
Extended European Search Report dated Jul. 31, 2023, of the corresponding European Patent Application No. 21770667.0, 5 pages.

* cited by examiner

[FIG. 1]
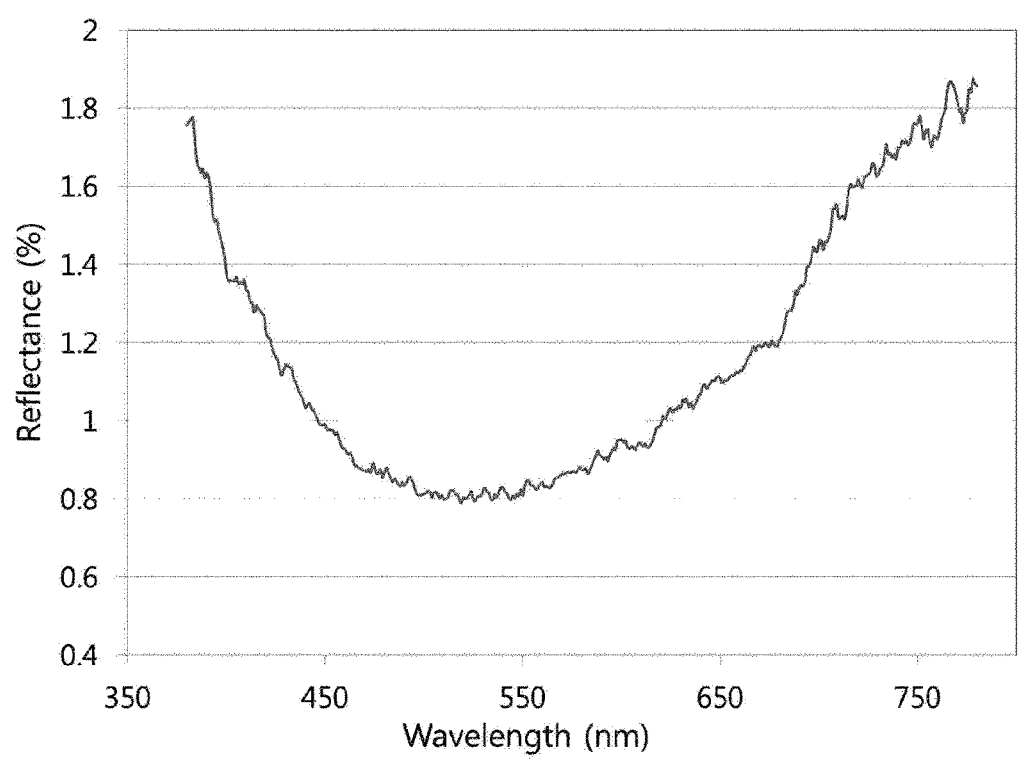

[FIG. 2]
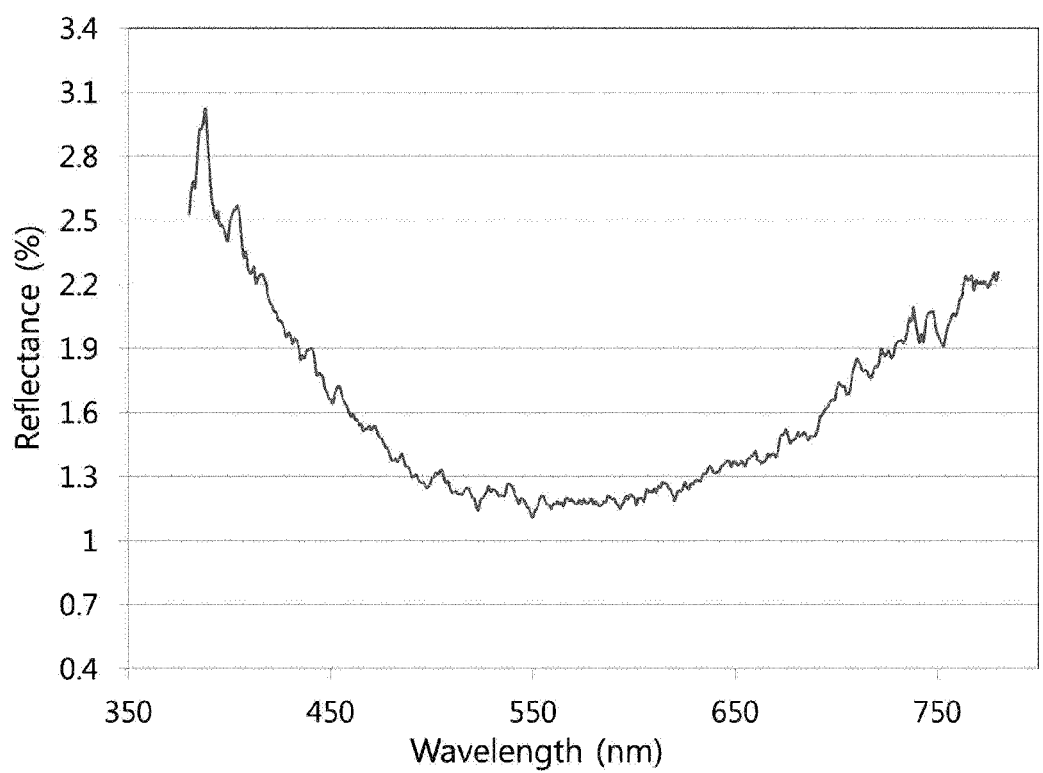

[FIG. 3]
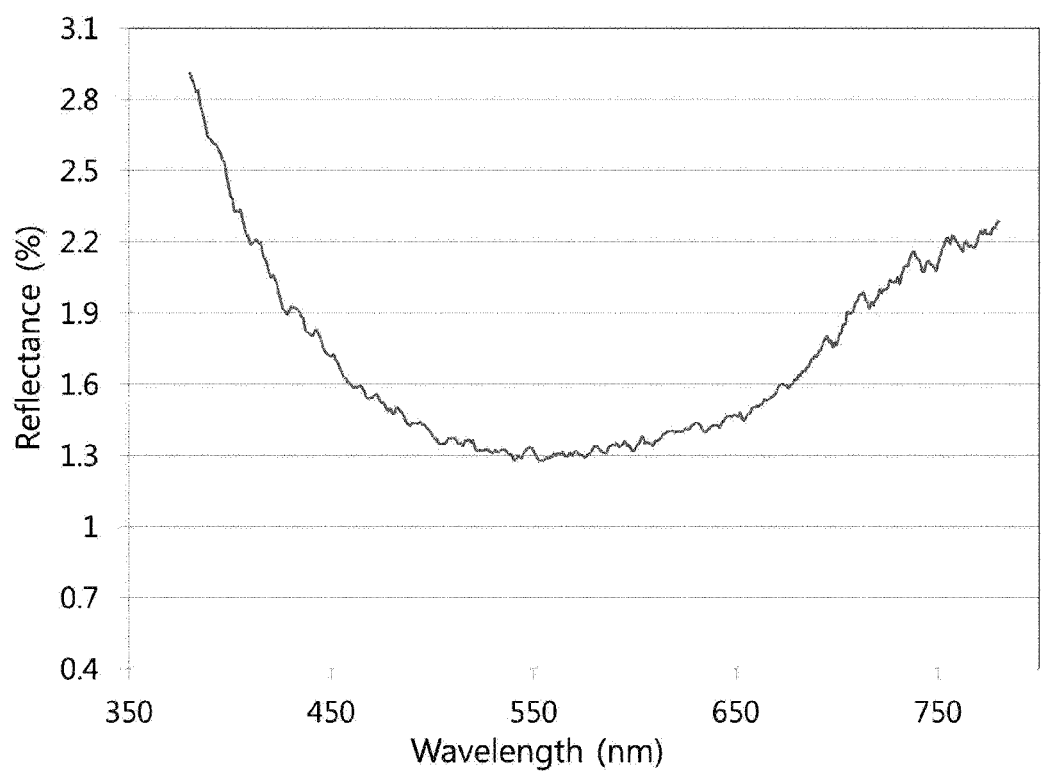

[FIG. 4]
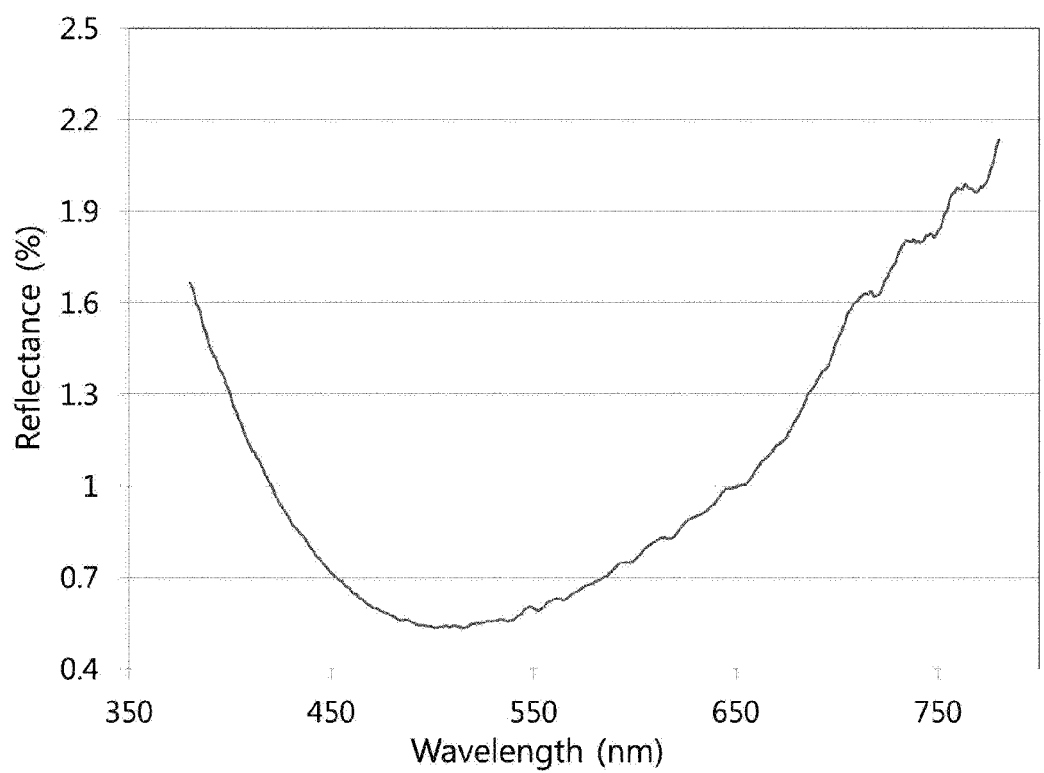

[FIG. 5]
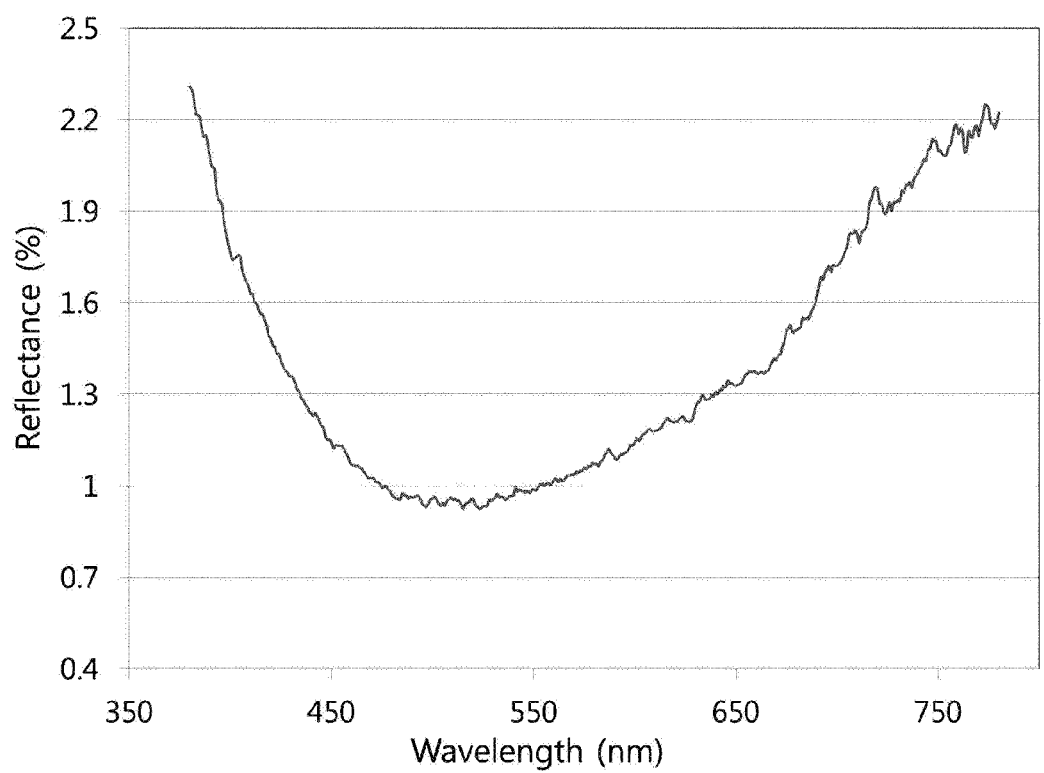

[FIG. 6]
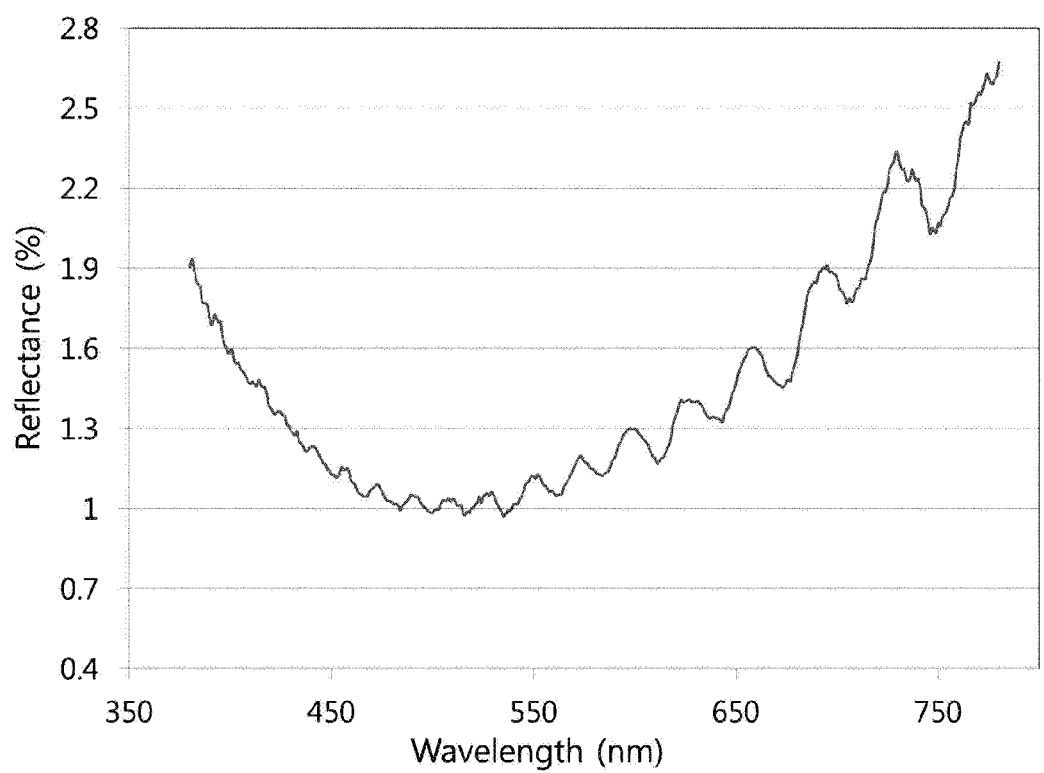

[FIG. 7]
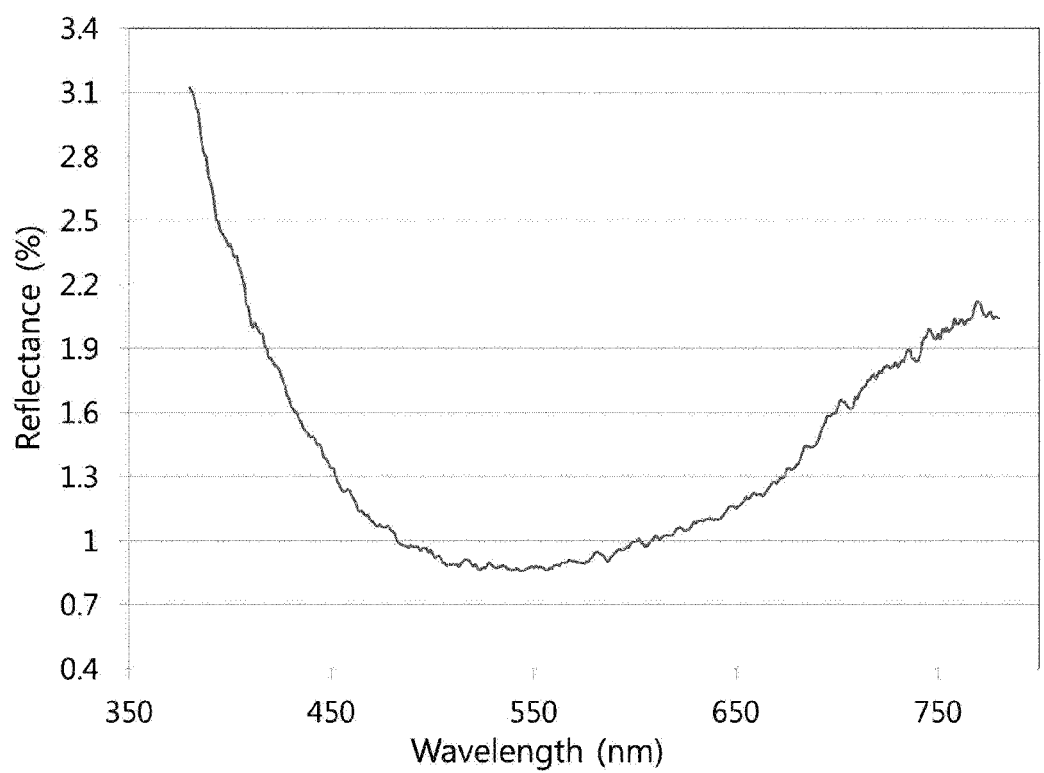

[FIG. 8]
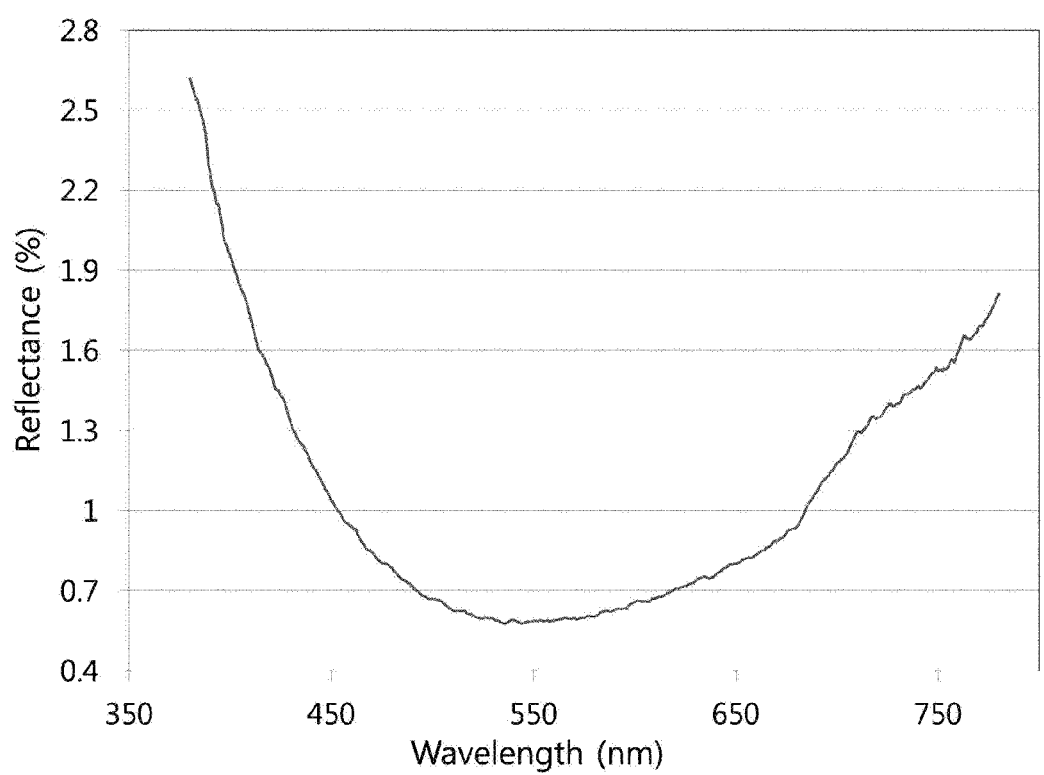

[FIG. 9]
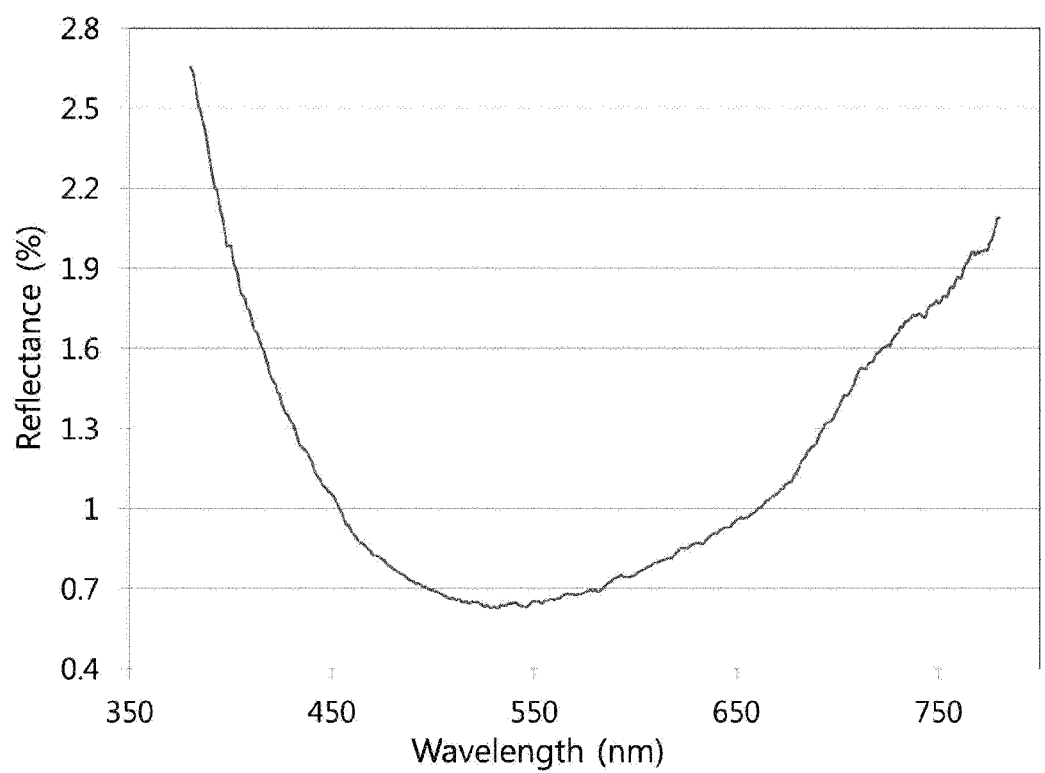

[FIG. 10]
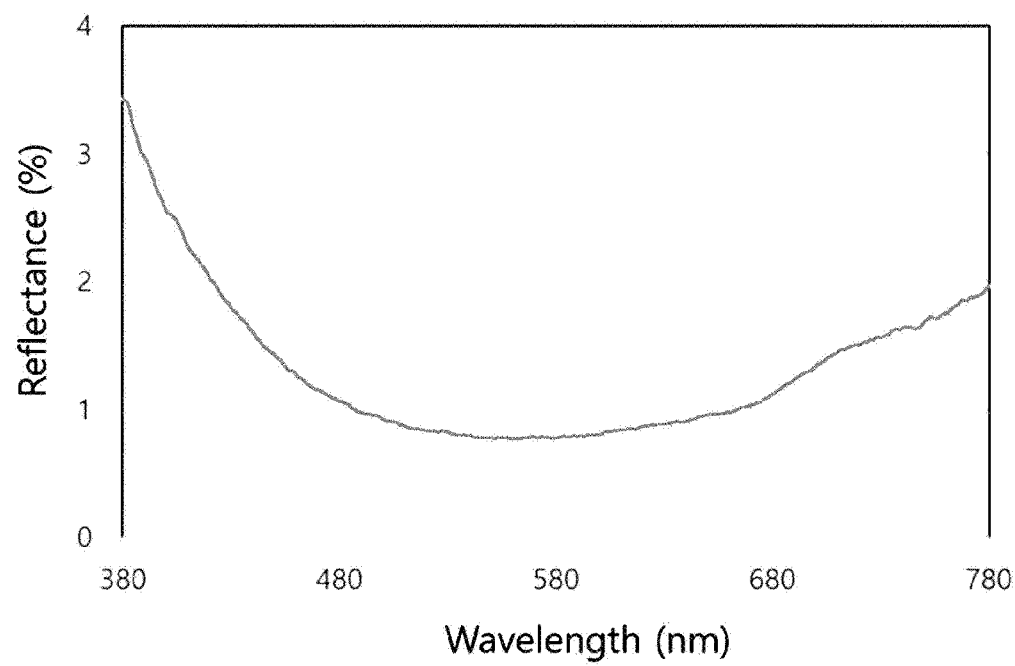

ANTI-REFLECTIVE FILM

CROSS-REFERENCE TO RELATED APPLICATION(S)

This application is a 35 U.S.C. 371 National Phase Entry Application from PCT/KR2021/003226, filed on Mar. 16, 2021, which claims the benefit of Korean Patent Application Nos. 10-2020-0032251 and 10-2020-0032253 filed on Mar. 16, 2020 and Korean Patent Application Nos. 10-2021-0033696 and 10-2021-0033702 filed on Mar. 16, 2021 with the Korean Intellectual Property Office, all of the disclosures of which are incorporated herein by reference in their entirety.

The present application relates to an anti-reflective film, a polarizing plate, a display device, and an organic light emitting diode display device.

BACKGROUND OF THE INVENTION

In general, in flat panel display devices such as a PDP, an LCD, etc., an anti-reflective film is installed so as to minimize reflection of incident light from the outside.

Methods for minimizing the reflection of light include a method of dispersing a filler such as fine inorganic particles, etc. in a resin, coating it on a substrate film, and forming unevenness (anti-glare: AG coating), a method of using light interference by forming multiple layers having different refractive indexes on a substrate film (anti-reflective; AR coating), a method of using them together, etc.

Among them, in the case of AG coating, although the absolute amount of reflected light is equivalent to that of common hard coatings, a low reflection effect can be obtained by reducing the amount of light entering the eyes using light scattering through unevenness. However, since the AG coating has lowered screen sharpness due to the surface unevenness, recently, many studies are being conducted on AR coating.

As films using the AR coating, those having a multi-layered structure in which a hard coating layer (high refractive index layer), a low reflective coating layer, etc. are stacked on a substrate film are being commercialized. However, since the method of forming multiple layers conducts individual processes for forming each layer, it has a disadvantage in terms of lowered scratch resistance due to weak interlayer adhesion (interface adhesion).

Further, previously, in order to improve scratch resistance of the low refractive index layer included in the anti-reflective film, a method of adding various particles of a nanometer size (for example, silica, alumina, zeolite, etc.) was mainly attempted. However, when nanometer-sized particles are used, there is a limitation in that it is difficult to simultaneously increase scratch resistance while lowering the reflectance of the low refractive index layer, and due to the nanometer-sized particles, the anti-fouling property of the surface of the low refractive index layer is significantly deteriorated.

Accordingly, in order to reduce the absolute reflection amount of incident light from the outside and improve the anti-fouling property as well as scratch resistance of the surface, many studies are being conducted, but the property improvement degree resulting therefrom is unsatisfactory.

BRIEF SUMMARY OF THE INVENTION

The present disclosure provides an anti-reflective film that can simultaneously realize high scratch resistance and anti-fouling properties while having high light transmittance, and that has colorless and transparent properties while realizing low reflectance.

The present disclosure also provides a polarizing plate including the anti-reflective film.

The present disclosure further provides a display device including the anti-reflective film.

The present disclosure further provides an organic light emitting diode display device including the anti-reflective film.

According to one aspect of the present disclosure, there is provided an anti-reflective film comprising: a hard coating layer; and a low refractive index layer, wherein a particle-mixed layer containing both hollow inorganic nanoparticles and solid inorganic nanoparticles and having a thickness of 1.5 nm to 22 nm exists in the low refractive index layer, and wherein the anti-reflective film has a ratio of the reflectance at a wavelength of 400 nm to the reflectance at a wavelength of 550 nm of 1.3 to 2.7.

According to another aspect of the present disclosure, there is provided a polarizing plate comprising the above-mentioned anti-reflective film and a polarizer.

According to yet another aspect of the present disclosure, there is provided a display device comprising the above-mentioned anti-reflective film.

According to a further aspect of the present disclosure, there is provided an organic light emitting diode display device comprising the above-mentioned anti-reflective film.

DETAILED DESCRIPTION OF THE INVENTION

Now, an anti-reflective film, a polarizing plate, a display device, and an organic light emitting diode display device according to specific embodiment of the present disclosure will be described in more detail.

In the present specification, a photopolymerizable compound collectively refers to a compound that causes a polymerization reaction if light, for example visible rays or ultraviolet rays, is irradiated thereto.

Further, a fluorine-containing compound refers to a compound containing at least one fluorine element in the compound.

Further, the "(meth)acryl" means including both acryl and methacryl.

The "(co)polymer" means including both copolymer and homopolymer.

Additionally, silica hollow particles are silica particles derived from a silicon compound or an organosilicon compound, wherein an empty space exists on the surface and/or inside of the silica particles.

Further, the low refractive index layer may refer to a layer having a low refractive index as compared with another layer in the anti-reflective film, for example, a hard coating layer.

For example, the low refractive index layer may have a refractive index of 1.65 or less, or 1.60 or less, or 1.57 or less, or 1.55 or less, or 1.53 or less at a wavelength of 550 nm.

According to one embodiment of the present disclosure, an anti-reflective film is provided, including: a hard coating layer; and a low refractive index layer, wherein a particle-mixed layer containing both hollow inorganic nanoparticles and solid inorganic nanoparticles and having a thickness of 1.5 nm to 22 nm exists in the low refractive index layer, and wherein the anti-reflective film has a ratio of the reflectance at a wavelength of 400 nm to the reflectance at a wavelength of 550 nm of 1.3 to 2.7.

When the anti-reflective film including the low refractive index layer and the hard coating layer has a low refractive index, for example, a reflectance of 1.5% or less at a wavelength of 550 nm, the reflectance in a blue region is higher than the reflectance in a green region. As a result, the anti-reflective layer may have a blue color and thus have an opacity or color property to the extent that it is not suitable for application to a polarizing plate or a display device.

Thus, the present inventors conducted studies on an anti-reflective film, confirmed through experiments that if a particle-mixed layer containing both hollow inorganic nanoparticles and solid inorganic nanoparticles and having a predetermined thickness in the low-refractive layer is included in the anti-reflective film, the bluishness can be significantly reduced while realizing low reflectance, and the colorless and transparent properties can be realized, thereby completing the present disclosure. In addition, the anti-reflective film can have a high light transmittance together with the above-described characteristics, and also can simultaneously high scratch resistance and anti-fouling properties.

As described above, due to the existence of the particle-mixed layer, the anti-reflective film can have colorless and transparent properties while realizing a low reflectance. As the low refractive index layer includes hollow inorganic nanoparticles and solid inorganic nanoparticles, it is possible to simultaneously realize high scratch resistance and anti-fouling properties while having high light transmittance.

Specifically, the anti-reflective film may have a characteristic that the ratio of the reflectance at a wavelength of 400 nm to the reflectance at a wavelength of 550 nm is 1.3 to 2.7, or 1.5 to 2.5.

As the anti-reflective film satisfies a characteristic that the ratio of the reflectance at a wavelength of 400 nm to the reflectance at a wavelength of 550 nm is 1.3 to 2.7, or 1.5 to 2.5, or 1.40 to 2.30, the anti-reflective film can have optical characteristics that the reflectance in a blue region is lower than the reflectance in a green region, thereby capable of having colorless and transparent properties while realizing a low reflectance.

When the ratio of the reflectance at a wavelength of 400 nm to the reflectance at a wavelength of 550 nm that the anti-reflective film has exceeds 2.7, the anti-reflective film may have a blue color, and thus may have an opacity or color property to the extent that it is not suitable for application to a polarizing plate or a display device. In particular, in the case of an anti-reflective film in which the ratio of the reflectance at a wavelength of 400 nm to the reflectance at a wavelength of 550 nm exceeds 2.7, the color reproduction capability of the organic light emitting diode display device may be deteriorated.

In a range where the anti-reflective film satisfies the ratio of the reflectance at a wavelength of 400 nm to the reflectance at a wavelength of 550 nm of 1.3 to 2.7, the reflectance of the anti-reflective film at a wavelength of 550 nm may be more than 0.5% and 1.5% or less, or 0.55% to 1.35%, or 0.59 to 1.32%, and the reflectance of the anti-reflective film at a wavelength of 400 nm may be 1.0% to 3.50%, or 1.20% to 2.60%.

On the other hand, the anti-reflective film includes the particle-mixed layer having a predetermined thickness in the low refractive index layer, and thus the ratio of the reflectance at a wavelength of 400 nm to the reflectance at a wavelength of 550 nm that the anti-reflective film has may be 1.3 to 2.7, or 1.5 to 2.5. Thereby, the anti-reflective film can have a characteristic that the absolute value of b* in a CIE Lab color space is 4 or less, or 3 or less, or 2 or less, or 1.5 or less.

More specifically, the anti-reflective film includes the particle-mixed layer in the low refractive index layer, and thus the absolute value of b* in the CIE Lab color space is 4 or less, or 3 or less, or 2 or less, or 1.5 or less.

Each numerical value in the CIE Lab color space can be measured by applying a general method of measuring each coordinate of the color space, and for example, can be measured according to a manufacturer's manual after positioning an equipment with an integrating sphere type detector (spectrophotometer) (ex. CM-2600d, KONICA MINOLTA) at a measuring position. In one example, each coordinate of the CIE Lab color space may also be measured under a state where the polarizer or polarizing plate is attached to a liquid crystal panel, for example, a highly reflective liquid crystal panel, or may also be measured for the polarizer or polarizing plate itself.

The CIE Lab color space is a color space in which the CIE XYZ color space is nonlinearly transformed based on human visual antagonistic theory. In this color space, the L value represents brightness, where if the L* value is 0, it represents black, and if the L* value is 100, it represents white. Also, if the a* value is a negative number, the color becomes a color slated to green and if it is a positive number, the color becomes a color slanted to red or violet. Furthermore, if the b* value is a negative number, the color becomes a color slanted to blue and if the b* value is a positive number, the color becomes a color slanted to yellow.

That is, as the anti-reflective film has a characteristic that the absolute value of b* value in the CIE Lab color space is 4 or less, or 3 or less, or 2 or less, or 1.5 or less, it can realize low reflectance and significantly reduce the degree of red or blue color while realizing low reflectance, thereby having a colorless and transparent property.

More specifically, the reflectance of the anti-reflection film at a wavelength of 550 nm may be more than 0.5% and 1.5% or less, or 0.55% to 1.35%, or 0.59 to 1.32%, it can have a characteristic that the absolute value of the b* value in the CIE Lab color space is 4 or less, 3 or less, or 2 or less, or 1.5 or less, even while realizing such a low reflectance.

In this manner, as the absolute value of the b* value in the CIE Lab color space is maintained at a low level while realizing a low reflectance, the anti-reflective film can be easily applied to a display having a high contrast ratio and brightness, and can realize high performance with high color reproduction rate.

In order to have the above-mentioned characteristics of the anti-reflective film, a particle-mixed layer containing both hollow inorganic nanoparticles and solid inorganic nanoparticles and having a thickness of 1.5 nm to 22 nm, or 2.0 nm to 20 nm, or 2.2 nm to 18.5 nm may exist in the low refractive index layer.

If the thickness of the particle-mixed layer is too small, canceling interference does not sufficiently occur in the anti-reflective layer, and the absolute value of the b* value may exceed 4.

Further, even when the thickness of the particle-mixed layer is too thick, the absolute value of the b* value in the CIE Lab color space that the anti-reflective film has may exceed 4, and thus the optical properties such as transparency of the anti-reflective film may be deteriorated.

Meanwhile, as described above, the particle-mixed layer includes both hollow inorganic nanoparticles and solid inorganic nanoparticles, and the volume ratio or distribution aspects thereof is not particularly limited.

The refractive index or thickness of the particle-mixed layer can be confirmed through various optical measurement methods, and for example, it can also be confirmed by using a method of fitting a polarization ellipticity measured by an ellipsometry method to a diffusion layer model.

The polarization ellipticity and related ellipsometry data ($\psi$, $\lambda$) measured by the ellipsometry method can be measured using commonly known methods and apparatuses. For example, ellipsometry measurements can be performed for the particle-mixed layer or other regions included in the low refractive index layer at an incident angle of 70° in a wavelength range of 380 nm to 1000 nm using a J. A. Woollam Co. M-2000 apparatus.

The measured ellipsometry data ($\psi$, $\lambda$) can be fitted to a diffuse layer model for the mixed layer and to a Cauchy model of Equation 1 for the lower layer and upper layer of the mixed-layer using Complete EASE software, so that MSE becomes 5 or less.

For the particle-mixed layer including both the hollow inorganic nanoparticles and the solid inorganic nanoparticles, the thickness and the like may not be defined by fitting the measured ellipsometry data to the Cauchy model of Equation 1.

When the range of the thickness and refractive index of the particle-mixed layer included in the low refractive index layer satisfies the above range, it can alleviate the abrupt difference in refractive index between each layer, whereby the anti-reflective film can maintain the absolute value of the b* value in the CIE Lab color space at a low level while realizing a low reflectance.

Meanwhile, by adjusting the composition of the binder resin included in the low refractive index layer, the type or content of particles, the specific process (for example, coating speed, coating method or drying conditions, etc.) in forming the low refractive index layer, the characteristics of the hard coating layer, and the like, it is possible to form a particle-mixed layer in the low refractive index layer.

Such an example is merely an example of a method or means for forming the particle-mixed layer, and even if the above methods and means are to be used simultaneously, the particle-mixed layer is not formed in the low refractive index layer. These can be adjusted according to the detailed materials for forming the low refractive index layer and the content thereof, the thickness of the low refractive index layer, the detailed materials of the hard coating layer and the content thereof, the surface characteristics and thickness of the hard coating layer, and the like. That is, the existence of the particle-mixed layer in the low refractive index layer and the effect resulting therefrom can be realized based on the description or examples of the specification.

For example, the hard coating layer contained in the anti-reflective film can include a binder resin including a photocurable resin and organic or inorganic fine particles dispersed in the binder resin. When a low refractive index layer including a binder resin, hollow inorganic nanoparticles and solid inorganic nanoparticles is formed on the hard coating layer through predetermined conditions, the particle-mixed layer may exist.

Further, the hard coating layer included in the anti-reflective film may have a surface energy of more than 34 mN/m, or more than 34 mN/m and 60 mN/m or less, 34.2 mN/m or more and 59 mN/m or less, or 34.5 mN/m or more and 58 mN/m or less, or between 35 mN/m and 55 mN/m. When a low refractive index layer including a binder resin, hollow inorganic nanoparticles and solid inorganic nanoparticles is formed on the hard coating layer having a surface energy in such numerical range, the above-mentioned mixed-particle layer may be formed in the process of fitting the surface energy in the low refractive index layer due to the high surface energy of the interface.

The surface energy of the hard coating layer can be obtained by adjusting the surface properties of the hard coating layer. For example, the surface energy of the hard coating layer can be controlled by adjusting the surface curing degree, drying conditions, and the like of the hard coating layer.

Specifically, the curing degree of the hard coating layer can be controlled by adjusting curing conditions such as a light irradiation amount or intensity or a flow rate of injected nitrogen in the process of forming the hard coating layer. For example, the hard coating layer can be obtained by subjecting the resin composition for forming the hard coating layer to ultraviolet irradiation at a dose of 5 to 100 mJ/cm$^3$, or 10 to 25 mJ/cm$^3$ under nitrogen purging in order to apply the nitrogen atmosphere condition.

The above-mentioned surface energy can be measured by determining a contact angle of di water (Gebhardt) and diiodomethane (Owens) at 10 points using a commonly known measuring device, for example, a contact angle measuring apparatus DSA-100 (Kruss), calculating an average value, and then converting the average contact angle into the surface energy. Specifically, in the measurement of the surface energy, the contact angle can be converted into the surface energy by using Dropshape Analysis software and applying the following Equation 2 of the OWRK (Owen, Wendt, Rable, Kaelble) method to the program.

$$\gamma_L(1+\cos\theta)=2\sqrt{\gamma_S^D\gamma_L^D}+2\sqrt{\gamma_S^P\gamma_L^P} \quad \text{[Equation 2]}$$

Further, as will be described later, the particle-mixed layer can be formed by applying a drying temperature, an air volume control and the like at the time of forming the low refractive index layer.

Specifically, the air volume can be adjusted in the drying process by adjusting the drying conditions, for example, the intake or exhaust amount in the process of forming the low refractive index layer. For example, in the drying process after coating of the low refractive index layer, the air volume may be 0.5 m/s or more, or 0.5 m/s to 10 m/s, or 0.5 m/s to 8 m/s, or 0.5 m/s to 5 m/s.

More specifically, the low refractive index layer can be formed on one surface of the hard coating layer, and the particle-mixed layer may be located at a distance of 12 nm or more, or 15 nm to 60 nm, or 16 nm to 50 nm from one surface of the hard coating layer.

The distance between the particle-mixed layer and one surface of the hard coating layer is not particularly limited, but as the particle-mixed layer is located at a distance of 12 nm or more from one surface of the hard coating layer, it plays a role of alleviating the abrupt difference in refractive index between the layers in the low refractive index layer, and the absolute value of the slope of the reflectance pattern at a short wavelength is lowered.

When the particle-mixed layer is located in a region of less than 12 nm from one surface of the hard coating layer, the effect of alleviating the difference in refractive index between layers in the low refractive index layer is limited, and the absolute value of the slope of the reflectance pattern cannot be sufficiently obtained.

The distance between the particle-mixed layer and the hard coating layer may be determined as the shortest distance among the distances between one surface of the hard coating layer and the particle-mixed layer on the basis of the plane direction of the hard coating layer. Alternatively, the distance between the particle-mixed layer and the hard coating layer can be defined as a thickness of a region between one surface of the hard coating layer and the particle-mixed layer.

The existence of the region between one surface of the hard coating layer and the particle-mixed layer can be confirmed by the ellipsometry method.

Each of the particle-mixed layer and the region between the one surface of the hard coat layer and the particle-mixed layer may have specific Cauchy parameters A, B, and C when polarization ellipticity measured by ellipsometry is fitted to a Cauchy model of Equation 1, and thus the particle-mixed layer and the region between the one surface of the hard coating layer and the particle-mixed layer may be distinguished from each other.

Specifically, ellipsometry measurements can be performed for the low refractive index layer at an incident angle of 70° in a wavelength range of 380 nm to 1000 nm using a J. A. Woollam Co. M-2000 apparatus. The measured ellipsometry data ($\psi$, $\lambda$) can be fitted to a Cauchy model of the following Equation 1 for low refractive index layer or the detailed layers of the low refractive index layer using Complete EASE software.

$$n(\lambda) = A + \frac{B}{\lambda^2} + \frac{C}{\lambda^4} \quad \text{[Equation 1]}$$

in Equation 1, $n(\lambda)$ is a refractive index at a wavelength $\lambda$, $\lambda$ is a range of 300 nm to 1800 nm, and A, B, and C are Cauchy parameters.

Further, the thickness of each of the particle-mixed layer or the region between one surface of the hard coating layer and the particle-mixed layer may also be derived through the fitting of the polarization ellipticity measured by the ellipsometry method to a Cauchy model of the Equation 1 and a Diffuse Layer Model. Therefore, each of the particle-mixed layer or the region between one surface of the hard coating layer and the particle-mixed layer can be defined in the low refractive index layer.

More specifically, the low refractive index layer is formed on one surface of the hard coating layer, and the low refractive index layer may include hollow inorganic nanoparticles and solid inorganic nanoparticles dispersed in a binder resin, wherein in the low refractive index layer, 50% by volume or more, or 60% by volume or more, or 70% by volume or more, or the numerical value or more or 95% by volume or less of the whole solid inorganic nanoparticles may exist between one surface of the hard coating layer and the particle-mixed layer.

In this manner, as the solid inorganic nanoparticles are mainly distributed in the region between one surface of the hard coating layer and the particle mixture layer, the region between the one surface of the hard coating layer and the mixed particle layer may have a refractive index of 1.46 to 1.65 at a wavelength of 550 nm.

"50% by volume or more of the whole solid inorganic nanoparticles exist in a specific region" is defined in the sense that the solid inorganic nanoparticles mainly exists in the specific region in the cross section of the low refractive index layer. Specifically, 70% by volume or more of the whole solid inorganic nanoparticles can be confirmed by measuring the volume of the whole solid inorganic nanoparticles.

For example, it is possible to visually confirm that each of the regions, in which the solid inorganic nanoparticles and the hollow inorganic nanoparticles each are mainly distributed, exists in the low refractive index layer. For example, it is possible to visually confirm that an individual layer or each region exists in the low refractive index layer, using a transmission electron microscope, a scanning electron microscope, and the like. In addition, the ratio of the solid inorganic nanoparticles and the hollow inorganic nanoparticles distributed in the corresponding layer or each of the corresponding regions in the low refractive index layer can also be confirmed.

Further, in the low refractive index layer, 50% by volume or more, or 60% by volume or more, or 70% by volume or more, or the numerical value or more or 95% by volume or less of the whole hollow inorganic nanoparticles may exist in the region from the particle-mixed layer to one surface of the low refractive index layer facing the hard coating layer. One surface of the low refractive index layer facing the hard coating layer means the other surface located in the direction opposite to the surface in contact with the hard coating layer.

In this manner, as the hollow inorganic nanoparticles are mainly distributed in the region from the particle-mixed layer to one surface of the low refractive index layer facing the hard coating layer, the region from the particle-mixed layer to one surface of the low refractive index layer facing the hard coating layer may have a refractive index of 1.0 to 1.40 at a wavelength of 550 nm.

The above-mentioned particle-mixed layer exists in the low-refractive layer of the anti-reflective film, the solid inorganic nanoparticles are mainly distributed near the interface between the hard coating layer and the low-refractive index layer, and the hollow inorganic nanoparticles are mainly distributed on the opposite side of the interface. It is possible to form an independent layer in which a region in which each of the solid inorganic nanoparticles and the hollow inorganic nanoparticles are mainly distributed is visually confirmed in the low refractive index layer.

Specifically, in the low refractive index layer of the anti-reflective film, when the solid inorganic nanoparticles are mainly distributed near the interface between the hard coating layer and the low refractive index layer, and the hollow inorganic nanoparticles are mainly distributed on the opposite side of the interface, lower reflectance can be achieved compared to the actual reflectance previously obtained using inorganic particles, and significantly improved scratch resistance and anti-fouling properties can be realized together.

Further, in the anti-reflective film of the embodiment, the region in which the solid inorganic nanoparticles and the hollow inorganic nanoparticles are unevenly distributed in the low refractive index layer is divided on the basis of the particle-mixed layer. Accordingly, the anti-reflective film has a reflectance of more than 0.5% and 1.5% or less at a wavelength of 550 nm and an absolute value of b* value of 4 or less, or 3 or less, or 2 or less, or 1.5 or less in the CIE Lab color space. Thereby, it is possible to significantly reduce the bluishness while achieving low reflectance, and to have colorless and transparent properties.

Further, each of the region between the one surface of the hard coating layer and the particle-mixed layer and the region from the particle-mixed layer to the one surface of the low refractive index layer facing the hard coating layer can be divided into individual layers, and as described above, the ratio of the solid inorganic nanoparticles and the hollow inorganic nanoparticles distributed in these individual layers can also be distinguished.

More specifically, for the region between the one surface of the hard coating layer and the particle-mixed layer, when the polarization ellipticity measured by an ellipsometry method was fitted to a Cauchy model of Equation 1 below, it can satisfy the condition that A is 1.00 to 1.65, B is 0.0010 to 0.0350, and C is 0 to $1*10^{-3}$.

Further, the region between one surface of the hard coating layer and the particle-mixed layer can satisfy the condition that A is 1.25 to 1.55, 1.30 to 1.53, or 1.40 to 1.52, B is 0.0010 to 0.0150, 0.0010 to 0.0080, or 0.0010 to 0.0050, and C is 0 to $8.0*10^{-4}$, 0 to $5.0*10^{-4}$, or 0 to $4.1352*10^{-4}$.

$$n(\lambda) = A + \frac{B}{\lambda^2} + \frac{C}{\lambda^4} \quad \text{[Equation 1]}$$

in Equation 1, $n(\lambda)$ is a refractive index at a wavelength $\lambda$, $\lambda$ is a range of 300 nm to 1800 nm, and A, B, and C are Cauchy parameters.

Further, for the region from the particle-mixed layer to one surface of the low refractive index layer facing the hard coating layer, when the polarization ellipticity measured by an ellipsometry method was fitted to the Cauchy model of Equation 1, it can satisfy the condition that A is 1.00 to 1.50, B is 0 to 0.007, and C is 0 to $1*10^{-3}$.

Further, the region from the particle-mixed layer to one surface of the optical function layer facing the polymer resin layer can satisfy the condition that A is 1.00 to 1.40, 1.00 to 1.39, 1.00 to 1.38, or 1.00 to 1.37, B is 0 to 0.0060, 0 to 0.0055, or 0 to 0.00513, and C is 0 to $8*10^{-4}$, 0 to $5.0*10^{-4}$, or 0 to $4.8685*10^{-4}$.

On the other hand, each of the particle-mixed layer, the region between one surface of the hard coating layer and the particle-mixed layer, and the region from the particle-mixed layer to one surface of the low refractive index layer facing the hard coating layer may share a common optical characteristic within one layer, and thus may be defined as a layer.

More specifically, each of the particle-mixed layer, the region between one surface of the hard coating layer and the particle-mixed layer, and the region from the particle-mixed layer to one surface of the low refractive index layer facing the hard coating layer has specific Cauchy parameters A, B and C, when the polarization ellipticity measured by the ellipsometry method was fitted to the Cauchy model of Equation 1, so that the first layer and the second layer can be distinguished from each other. In addition, since the thickness of each layer can also be derived through fitting the polarization ellipticity measured by the ellipsometry to the Cauchy model of the Equation 1, it becomes possible to define each layer within the low refractive index layer.

Meanwhile, the Cauchy parameters A, B, and C derived through the fitting of the polarization ellipticity measured by ellipsometry to a Cauchy model of Equation 1 may be average values in one region. Thus, if an interface exists between the respective layers, a region in which the Cauchy parameters A, B, and C of the respective layers are overlapped may exist. However, even in this case, the thicknesses and positions of the regions satisfying the average values of the Cauchy parameters A, B, and C of each of the layers may be specified.

Meanwhile, whether the hollow inorganic nanoparticles and solid inorganic nanoparticles exist in the specified region is determined by whether respective hollow inorganic nanoparticles or solid inorganic nanoparticles exist in the specified region, and is determined by excluding the particles existing over the boundary surface of the specific region.

The specific distribution of the solid inorganic nanoparticles and the hollow inorganic nanoparticles in the low refractive index layer is a specific manufacturing method to be described later can be obtained by a specific preparation method described later, for example, a method such as adjusting the density difference between the solid inorganic nanoparticles and the hollow inorganic nanoparticles and adjusting the drying temperature of the photocurable resin composition for forming a low refractive index layer including the two kinds of nanoparticles, the above-mentioned method for forming the particle-mixed layer, and the like.

Specifically, the solid inorganic nanoparticles may have a density which is 0.50 g/cm³ or more higher than that of the hollow inorganic nanoparticles, and the difference in density between the solid inorganic nanoparticles and the hollow inorganic nanoparticles is 0.50 g/cm³ to 3.00 g/cm³, or 0.50 g/cm³ to 2.50 g/cm³, or 0.50 g/cm³ to 2.00 g/cm³, or 0.60 g/cm³ to 2.00 g/cm³.

Due to such a difference in density, in the low refractive index layer formed on the hard coating layer, the solid inorganic nanoparticles may be located on the side closer to the hard coating layer.

However, when the difference in density between the solid inorganic nanoparticles and the hollow inorganic nanoparticles is too large, the solid inorganic particles may be concentrated at the interface between the low refractive index layer and the hard coating layer, or the movement and uneven distribution of the particles may not be smooth in the process of forming the low refractive index layer, and a stain may occur on the surface of the low refractive index layer or the haze of the low refractive index layer may increase significantly, thereby reducing transparency.

Specific types of the solid inorganic nanoparticles include zirconia, titania, antimony pentoxide, silica or tin oxide.

Further, specific types of the hollow inorganic nanoparticles include hollow silica, and the like.

Meanwhile, the low refractive index layer may include a binder resin, and hollow inorganic nanoparticles and solid inorganic nanoparticles dispersed in the binder resin.

The photopolymerizable compound contained in the photocurable coating composition of the above embodiment may form a base material of the binder resin of the low refractive index layer prepared.

Specifically, the photopolymerizable compound may include monomers or oligomers including (meth)acrylate or vinyl groups. More specifically, the photopolymerizable compound may include monomers or oligomers including one or more, two or more, or three or more (meth)acrylate or vinyl groups.

Specific examples of the monomers or oligomers including a (meth)acrylate may include pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tolylene diisocyanate, xylene diisocyanate, hexamethylene diisocyanate, trimethylolpropane tri(meth)acrylate, trimethylolpropane polyethoxy tri(meth)acrylate, trimethylolpropane trimethacrylate, ethylene glycol dimethacrylate, butanediol dimethacrylate, hexaethyl methacrylate, butyl methacrylate, or a mixture of two or more thereof, or a urethane-modified acrylate oligomer, an epoxide acrylate oligomer, an ether acrylate oligomer, a dendritic acrylate oligomer, or a mixture of two or more thereof. Herein, the molecular weight of the oligomers is preferably 1000 to 10,000.

Specific examples of the monomer or oligomer containing a vinyl group include divinylbenzene, styrene, and para-methyl styrene.

The content of the photopolymerizable compound in the photocurable coating composition is not particularly limited, but in consideration of the mechanical properties of the finally produced low refractive index layer or anti-reflective film, the content of the photopolymerizable compound in the solid content of the photocurable coating composition can be 5% by weight to 80% by weight. The solid content of the photocurable coating composition means only a liquid component in the photocurable coating composition, for example, a solid component excluding components such as organic solvents that can be optionally included as described below.

The solid inorganic nanoparticles mean particles having a maximum diameter of 100 nm or less, and having a form in which empty voids are not present therein.

Further, the hollow inorganic nanoparticles mean particles having a maximum diameter of 200 nm or less and having a form in which empty voids are present on the surface and/or inside thereof.

The solid inorganic nanoparticles may have a diameter of 0.5 to 100 nm, or 1 to 50 nm, or 5 to 30 nm, or 10 to 20 nm.

The hollow inorganic nanoparticles may have a diameter of 1 to 200 nm, or 10 to 100 nm, or 50 to 120 nm, or 30 to 90 nm, or 40 to 80 nm.

The diameter of the hollow inorganic nanoparticles and the diameter of the solid inorganic nanoparticles may be different.

Further, the diameter of the hollow inorganic nanoparticles may be larger than the diameter of the solid inorganic nanoparticles.

The diameter of each of the solid inorganic nanoparticles and the hollow inorganic nanoparticles may mean the longest diameter of the nanoparticles confirmed in the cross section.

Meanwhile, each of the solid inorganic nanoparticles and the hollow inorganic nanoparticles may have at least one reactive functional group selected from the group consisting of a (meth)acrylate group, an epoxide group, a vinyl group, and a thiol group on the surface thereof. As each of the solid inorganic nanoparticles and the hollow inorganic nanoparticles contains the above-described reactive functional group on the surface, the low refractive index layer can have a higher degree of crosslinking, thereby securing more improved scratch resistance and anti-fouling property.

The low refractive index layer can be obtained by coating the photocurable coating composition onto a predetermined substrate and photocuring the coated product. The specific kind and thickness of the substrate are not particularly limited, and a substrate known to be usable in the production of a low refractive index layer or an anti-reflective film can be used without particular limitation.

The method and apparatus commonly used for coating the photocurable coating composition can be used without particular limitation. For example, a bar coating method, such as using a Meyer bar or the like, a gravure coating method, a 2-roll reverse coating method, a vacuum slot die coating method, a 2-roll coating method, or the like can be used.

The low refractive index layer may have a thickness of 20 nm to 240 nm, or 50 nm to 200 nm, or 80 nm to 180 nm.

In the step of photocuring the photocurable coating composition, ultraviolet light or visible light having a wavelength of 200 nm to 400 nm can be irradiated, and the amount of exposure during irradiation is preferably 100 to 4,000 mJ/cm$^3$. The exposure time is not particularly limited, and can be appropriately varied depending on the exposure apparatus used, the wavelength of the irradiated light, or the amount of light exposure.

Further, in the step of photocuring the photocurable coating composition, nitrogen purging or the like may be performed to apply a nitrogen atmosphere condition.

Meanwhile, the binder resin included in the low refractive index layer may include a crosslinked (co)polymer between a (co)polymer of a photopolymerizable compound and a fluorine-containing compound including a photoreactive functional group.

The above-mentioned low refractive index layer can be prepared from a photocurable coating composition including a photopolymerizable compound, a fluorine-containing compound including a photoreactive functional group, hollow inorganic nanoparticles, solid inorganic nanoparticles, and a photoinitiator. Therefore, the binder resin included in the low refractive index layer may include a crosslinked (co)polymer between the (co)polymer of the photopolymerizable compound and the fluorine-containing compound including the photoreactive functional group.

The hydrophobicity of the binder resin including the fluorine-containing compound and the hydrophilicity of the hard coating layer due to the high surface energy may affect the speed at which the fluorine-containing compound moves to the surface of the coating layer during the drying process of the anti-reflective film. As a result, convection is formed in the solvent, and the fine particles evenly distributed in the solvent may exhibit different behaviors depending on the characteristics of the particles. In particular, in this process, each particle can form a plurality of different layers, and when the evaporation of the solvent is finished during the formation of each layer, the above-mentioned particle-mixed layer may be formed.

The rise of the surface of the fluorine-containing compound can induce the rise of the surface of the hollow inorganic nanoparticles, and solid inorganic nanoparticles having a relatively small size are less affected and phase separation of each particle may occur. During the process, evaporation of the solvent is completed and the fluidity of the particles disappears, and the above-mentioned mixed layer can be formed by having a predetermined thickness in the low refractive index layer.

The photopolymerizable compound may further include a fluorine-based (meth)acrylate-based monomer or oligomer in addition to the above-described monomers or oligomers. When the fluorine-based (meth) acrylate-based monomer or oligomer is further included, the weight ratio of the fluorine-based (meth)acrylate-based monomer or oligomer to the (meth)acrylate or vinyl group-containing monomer or oligomer may be 0.1% to 10%.

Specific examples of the fluorine-based (meth)acrylate-based monomer or oligomer include at least one compound selected from the group consisting of the following Chemical Formulas 11 to 15.

[Chemical Formula 11]

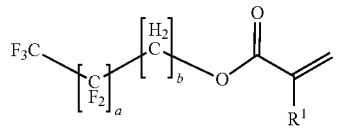

in Chemical Formula 11, R$^1$ is a hydrogen group or an alkyl group having 1 to 6 carbon atoms, a is an integer of 0 to 7, and b is an integer of 1 to 3.

[Chemical Formula 12]

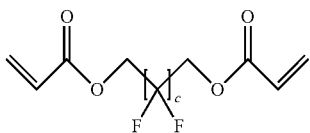

in Chemical Formula 12, c is an integer of 1 to 10.

[Chemical Formula 13]

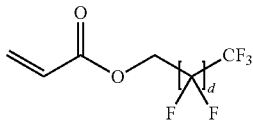

in Chemical Formula 13, d is an integer of 1 to 11.

[Chemical Formula 14]

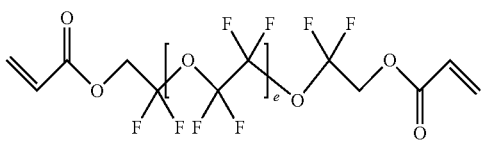

in Chemical Formula 14, e is an integer of 1 to 5.

[Chemical Formula 15]

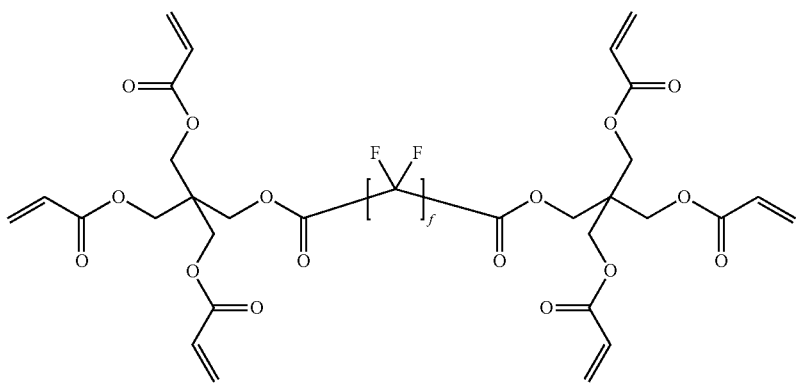

in Chemical Formula 15, f is an integer of 4 to 10.

Meanwhile, the low refractive index layer may further include a portion derived from a fluorine-based compound containing a photoreactive functional group.

One or more photoreactive functional groups may be contained or substituted in the fluorine-based compound including a photoreactive functional group, wherein the photoreactive functional group means a functional group capable of participating in the polymerization reaction by irradiation with light, for example, by irradiation with visible light or ultraviolet light. The photoreactive functional group may include various functional groups known to be capable of participating in the polymerization reaction by irradiation with light, and specific examples thereof include a (meth)acrylate group, an epoxide group, a vinyl group or a thiol group.

The fluorine-based compound containing a photoreactive functional group may have a weight average molecular weight (weight average molecular weight in terms of polystyrene measured by GPC method) of 2,000 to 200,000, preferably 5,000 to 100,000.

If the weight average molecular weight of the fluorine-containing compound including photoreactive functional groups is too small, the fluorine-containing compound may not be uniformly and effectively arranged on the surface of the photocurable coating composition and may be positioned inside of the finally prepared low refractive index layer, and thus the anti-fouling property of the low refractive index layer may be deteriorated and the crosslinking density of the low refractive index layer may be lowered, thus deteriorating mechanical properties such as total strength, scratch resistance, etc.

Further, if the weight average molecular weight of the fluorine-containing compounds including photoreactive functional groups is too high, compatibility with other components in the photocurable coating composition may be lowered, and thus haze of the finally prepared low refractive index layer may increase or light transmittance may decrease, and the strength of the low refractive layer may also be deteriorated.

Specifically, the fluorine-containing compound including a photoreactive functional group may include one or more selected from the group consisting of: i) aliphatic compounds or alicyclic compounds substituted by one or more photoreactive functional groups, in which at least one carbon is substituted by one or more fluorine atoms; ii) heteroaliphatic compounds or heteroalicyclic compounds substituted by one or more photoreactive functional groups, in which at least one hydrogen is substituted by fluorine, and at least one carbon is substituted by silicon; iii) a polydialkyl siloxane-based polymer (for example, a polydimethyl siloxane-based polymer) substituted by one or more photoreactive functional groups, in which at least one silicon atom is substituted by one or more fluorine atoms; iv) polyether compounds substituted by one or more photoreactive functional groups, in which at least one hydrogen is substituted by fluorine, and mixtures or copolymers of two or more of i) to iv).

The photocurable coating composition may include 20 to 300 parts by weight of the fluorine-containing compound including a photoreactive functional group, based on 100 parts by weight of the photopolymerizable compound.

If the fluorine-containing compound including a photoreactive functional group is excessively added compared to the photopolymerizable compound, the coatability of the photocurable coating composition of the above embodiment may be deteriorated or the low refractive index layer obtained from the photocurable coating composition may not have sufficient durability or scratch resistance. Further, if the content of the fluorine-containing compound including a photoreactive functional group is too small compared to the photopolymerizable compound, the low refractive index layer obtained from the photocurable coating composition may not have sufficient mechanical properties such as anti-fouling property, scratch resistance, etc.

The fluorine-containing compound including a photoreactive functional group may further include silicon or a silicon-containing compound. That is, the fluorine-containing compound including a photoreactive functional group may optionally contain silicon or a silicon-containing compound therein, and specifically, the content of silicon in the fluorine-containing compound including a photoreactive functional group may be 0.1% by weight to 20% by weight.

The silicon included in the fluorine-containing compound including a photoreactive functional group may increase compatibility with other components included in the photocurable coating composition, and thus may prevent the generation of haze in the finally prepared low refractive index layer, thereby performing the role of increasing transparency. Meanwhile, if the content of silicon in the fluorine-containing compound including a photoreactive functional group becomes too high, compatibility between the fluorine-containing compound and other components included in the photocurable coating composition may be rather deteriorated, and thus the finally prepared low refractive index layer or anti-reflective film may not have sufficient light transmittance or anti-reflective performance and the anti-fouling property of the surface may also be deteriorated.

The low refractive index layer may include 10 to 500 parts by weight, or 50 to 480 parts by weight, or 200 to 400 parts by weight of the hollow inorganic nanoparticles, based on 100 parts by weight of the (co)polymer of photopolymerizable compounds.

The low refractive index layer may include 10 to 400 parts by weight, or 50 to 380 parts by weight, or 80 to 300 parts by weight, or 100 to 250 parts by weight of the solid inorganic nanoparticles, based on 100 parts by weight of the (co)polymer of photopolymerizable compounds.

The low refractive index layer may include the hollow inorganic nanoparticles and the solid inorganic nanoparticles in relatively high contents, respectively, relative the low refractive index layer included in the known optical film.

If the content of the hollow inorganic nanoparticles and solid inorganic nanoparticles in the low refractive index layer becomes excessive, in the preparation process of the low refractive index layer, phase separation between the hollow inorganic nanoparticles and the solid inorganic nanoparticles may not sufficiently occur and they may unevenly distribute, and thus reflectance may increase, and surface unevenness may be excessively generated to deteriorate the anti-fouling property.

Further, if the content of the hollow inorganic nanoparticles and solid inorganic nanoparticles in the low refractive index layer is too small, it may be difficult for the majority of the solid inorganic nanoparticles to be positioned near the interface between the hard coating layer and the low refractive layer, and the reflectance of the low refractive layer may significantly increase.

The hollow inorganic nanoparticles and the solid inorganic nanoparticles may be respectively included in the composition as a colloidal phase dispersed in a predetermined dispersion medium. Each colloidal phase including the hollow inorganic nanoparticles and the solid inorganic nanoparticles may include an organic solvent as a dispersion medium.

Each content of the hollow inorganic nanoparticles and the solid inorganic nanoparticles in a colloidal phase may be determined considering each content range of the hollow inorganic nanoparticles and the solid inorganic nanoparticles in the photocurable coating composition or the viscosity of the photocurable coating composition, etc., and for example, each solid content of the hollow inorganic nanoparticles and the solid inorganic nanoparticles in the colloidal phase may be 5% by weight to 60% by weight.

Here, the organic solvent in the dispersion medium may include alcohols such as methanol, isopropyl alcohol, ethylene glycol, butanol, etc.; ketones such as methyl ethyl ketone, methyl isobutyl ketone, etc.; aromatic hydrocarbons such as toluene, xylene, etc.; amides such as dimethylformamide, dimethylacetamide, N-methylpyrrolidone, etc.; esters such as ethyl acetate, butyl acetate, gamma butyrolactone, etc.; ethers such as tetrahydrofuran, 1,4-dioxane, etc.; or mixtures thereof.

As the photopolymerization initiator, any compounds known to be usable in a photocurable resin composition may be used without significant limitations, and specifically, a benzophenone-based compound, an acetophenone-based compound, a biimidazole-based compound, a triazine-based compound, an oxime-based compound, or mixtures of two or more kinds thereof may be used.

The photopolymerization initiator may be used in the content of 1 to 100 parts by weight, based on 100 parts by weigh of the photopolymerizable compound. If the content of the photopolymerization initiator is too small, materials that remain without being cured in the step of photocuring of the photocurable coating composition may be generated. If the content of the photopolymerization initiator is too large, unreacted initiators may remain as impurities or a crosslinking density may be lowered, and thus the mechanical properties of the prepared film may be deteriorated or reflectance may significantly increase.

Meanwhile, the photocurable coating composition may further include an organic solvent.

Non-limiting examples of the organic solvent may include, for example, ketones, alcohols, acetates, ethers, and mixtures of two or more kinds thereof.

Specific examples of the organic solvent may include ketones such as methyl ethyl ketone, methyl isobutyl ketone, acetylacetone, isobutyl ketone, etc.; alcohols such as methanol, ethanol, diacetone alcohol, n-propanol, i-propanol, n-butanol, i-butanol, t-butanol, etc.; acetates such as ethyl acetate, i-propyl acetate, polyethylene glycol monomethylether acetate, etc.; ethers such as tetrahydrofuran or propylene glycol monomethylether, etc.; and mixtures of two or more kinds thereof.

The organic solvent may be added when mixing the components included in the photocurable coating composition, or each component may be added to the photocurable coating composition while being dispersed in or mixed in the organic solvent. If the content of the organic solvent in the photocurable coating composition is too small, flowability of the photocurable coating composition may be deteriorated, and thus defects such as stripes, etc. may be generated in the finally prepared film. Further, if the organic solvent is excessively added, solid content may decrease, and thus coating and film formation may not be sufficiently achieved, thus deteriorating the physical properties or surface property of the film, and generating defects in the process of drying and curing. Thus, the photocurable coating composition may include an organic solvent such that the total solid concentration of the included components may become 1 to 50% by weight, or 2 to 20% by weight.

The hard coating layer may have a thickness of 0.1 μm to 100 μm.

The anti-reflective film may further include a substrate bonded to the other side of the hard coating layer. Specific kinds or thicknesses of the substrate are not particularly limited, and substrates known to be used in the preparation of low refractive layers or anti-reflective films may be used without particular limitations.

Meanwhile, an anti-reflective film of the above embodiment can be provided through the preparation method of an anti-reflective film, including the steps of: applying a resin composition for forming a low refractive index layer including a photopolymerizable compound or a (co)polymer thereof, a fluorine-containing compound including a photoreactive functional group, a photoinitiator, hollow inorganic nanoparticles and solid inorganic nanoparticles onto a hard coating layer, and drying it at a temperature of 35° C. to 100° C.; and photocuring the dried product of the resin composition.

The low refractive index layer can be formed by applying a resin composition for forming a low refractive index layer including a photopolymerizable compound or a (co)polymer thereof, a fluorine-containing compound including a photoreactive functional group, a photoinitiator, hollow inorganic nanoparticles, and solid inorganic nanoparticles on a hard coating layer, and drying it at a temperature of 35° C. to 100° C., or 40° C. to 80° C.

If the temperature for drying the resin composition for forming a low refractive index layer applied on the hard coating layer is less than 35° C., the formed low refractive index layer may be significantly deteriorated in anti-fouling property. Further, if the temperature for drying the resin composition for forming a low refractive index layer applied on the hard coating layer is greater than 100° C., in the preparation process of the low refractive index layer, phase separation between the hollow inorganic nanoparticles and the solid inorganic nanoparticles may not sufficiently occur and they may unevenly distribute, thus deteriorating scratch resistance and anti-pollution properties of the low refractive layer and also significantly increasing in the reflectivity.

In the process of drying the resin composition for forming the low refractive index layer applied on the hard coating layer, by adjusting the density difference between the solid inorganic nanoparticles and the hollow inorganic nanoparticles together with the drying temperature, the low refractive layer having the above-mentioned characteristics can be formed. The solid inorganic nanoparticles may have a density which is 0.50 g/cm³ or more higher than that of the hollow inorganic nanoparticles. Due to such a density difference, the solid inorganic nanoparticles in the low refractive index layer formed on the hard coating layer may be located on the side closer to the hard coating layer.

Meanwhile, the step of drying the resin composition for forming a low refractive layer applied onto the hard coating layer at a temperature of 35° C. to 100° C. may be performed for 10 seconds to 5 minutes, or 30 seconds to 4 minutes.

If the drying time is too short, phase separation between the solid inorganic nanoparticles and the hollow inorganic nanoparticles may not sufficiently occur. To the contrary, if the drying time is too long, the formed low refractive index layer may erode the hard coating layer.

Meanwhile, as the hard coating layer, commonly known hard coating layers may be used without particular limitations.

One example of the hard coating layer may include a hard coating layer including a binder resin including a photocurable resin, and organic or inorganic fine particles dispersed in the binder resin.

The photocurable resin included in the hard coating layer may be a polymer of photocurable compounds capable of inducing a polymerization reaction if light such as UV, etc. is irradiated, as is commonly known in the art. Specifically, the photocurable resin may include one or more selected from the group consisting of: reactive acrylate oligomers such as a urethane acrylate oligomer, an epoxide acrylate oligomer, a polyester acrylate, and a polyether acrylate; and multifunctional acrylate monomers such as dipentaerythritol hexaacrylate, dipentaerythritol hydroxy pentaacrylate, pentaerythritol tetraacrylate, pentaerythritol triacrylate, trimethylene propyl triacrylate, propoxylated glycerol triacrylate, trimethylpropane ethoxy triacrylate, 1,6-hexanediol acrylate, propoxylated glycerol triacrylate, tripropylene glycol diacrylate, and ethylene glycol diacrylate.

Although the particle diameter of the organic or inorganic fine particles is not specifically limited, for example, the organic fine particles may have a particle diameter of 1 μm to 10 μm, and the inorganic fine particles may have a particle diameter of 1 nm to 500 nm, or 1 nm to 300 nm. The particle diameter of the organic or inorganic fine particles may be defined as a volume average particle diameter.

Further, although specific examples of the organic or inorganic fine particles included in the hard coating layer are not particularly limited, for example, the organic or inorganic fine particles may be organic fine particles selected from the group consisting of acryl-based resin particles, styrene-based resin particles, epoxide resin particles, and nylon resin particles, or inorganic fine particles selected from the group consisting of silicon oxide, titanium dioxide, indium oxide, tin oxide, zirconium oxide, and zinc oxide.

The binder resin of the hard coating layer may further include a high molecular weight (co)polymer with a weight average molecular weight of 10,000 or more.

The high molecular weight (co)polymer may be one or more selected from the group consisting of a cellulose-based polymer, an acryl-based polymer, a styrene-based polymer, an epoxide-based polymer, a nylon-based polymer, a urethane-based polymer, and a polyolefin-based polymer.

Meanwhile, another example of the hard coating layer may include a hard coating layer including a binder resin of a photocurable resin; and an antistatic agent dispersed in the binder resin.

The photocurable resin included in the hard coating layer may be a polymer of photocurable compounds capable of inducing a polymerization reaction by the irradiation of light such as UV, etc., that is commonly known in the art. However, preferably, the photocurable compound may be multifunctional (meth)acrylate-based monomers or oligomers, wherein it is advantageous in terms of securing of the properties of the hard coating layer for the number of (meth)acrylate-based functional groups to be 2 to 10, preferably 2 to 8, and more preferably 2 to 7. More preferably, the photocurable compound may be one or more selected from the group consisting of pentaerythritol tri(meth)acrylate, pentaerythritol tetra(meth)acrylate, dipentaerythritol penta(meth)acrylate, dipentaerythritol hexa(meth)acrylate, dipentaerythritol hepta(meth)acrylate, tripentaerythritol hepta(meth)acrylate, tolylene diisocyanate, xylene diisocyanate, hexamethylene diisocyanate, trimethylol propane tri(meth)acrylate, and trimethylol propane polyethoxy tri(meth)acrylate.

The antistatic agent may be: a quaternary ammonium salt compound; pyridinium salt; a cationic compound having 1 to 3 amino groups; an anionic compound such as a sulfonic acid base, a sulfuric ester base, a phosphoric ester base, a phosphonic acid base, etc.; an amphoteric compound such as an amino acid-based or amino sulfuric ester-based compound, etc.; a non-ionic compound such as an imino alcohol-based compound, a glycerin-based compound, a polyethylene glycol-based compound, etc.; an organometal compound such as a metal alkoxide compound containing tin or titanium, etc.; a metal chelate compound such as an acetylacetonate salt of the organometal compound, etc.; reactants or polymerized products of two or more kinds of these compounds; or mixtures of two or more kinds of these compounds. Here, the quaternary ammonium salt compound may be a compound having one or more quaternary ammonium salt groups in the molecule, and a low molecular type or a high molecular type may be used without limitations.

Further, as the antistatic agent, a conductive polymer and metal oxide fine particles may also be used. The conductive polymer may include an aromatic conjugated poly(paraphenylene), a heterocyclic conjugated polypyrrole, a polythiophene, an aliphatic conjugated polyacetylene, a heteroatom-containing conjugated polyaniline, a mixed conjugated poly (phenylene vinylene), a multi-chain type of conjugated compound which is a conjugated compound having multiple conjugated chains in the molecule, a conductive complex in which a conjugated polymer chain is grafted on or block copolymerized with a saturated polymer, etc. Further, the metal oxide fine particles may include zinc oxide, antimony oxide, tin oxide, cerium oxide, indium tin oxide, indium oxide, aluminum oxide, antimony-doped tin oxide, aluminum-doped zinc oxide, etc.

The hard coating layer including a binder resin of a photocurable resin, and an antistatic agent dispersed in the binder resin, may further include one or more compounds selected from the group consisting of an alkoxy silane-based oligomer and a metal alkoxide-based oligomer.

Although the alkoxy silane-based compound may be one commonly used in the art, preferably, it may include one or more compounds selected form the group consisting of tetramethoxysilane, tetraethoxysilane, tetraisopropoxysilane, methyltrimethoxysilane, methyltriethoxysilane, methacryloxypropyltrimethoxysilane, glycidoxy propyl trimethoxy silane, and glycidoxypropyltriethoxysilane.

Further, the metal alkoxide-based oligomer may be prepared by a sol-gel reaction of a composition including a metal alkoxide-based compound and water. The sol-gel reaction may be conducted by a similar method to the above-explained preparation method of the alkoxy silane-based oligomer.

However, since the metal alkoxide-based compound may rapidly react with water, the sol-gel reaction may be performed by diluting the metal alkoxide-based compound in an organic solvent, and then, slowly dripping water thereto. At this time, considering the reaction efficiency, it is preferable that the mole ratio of the metal alkoxide-based compound to water (based on metal ions) is adjusted within a range of 3 to 170.

Here, the metal alkoxide-based compound may be one or more compounds selected from the group consisting of titanium tetra-isopropoxide, zirconium isopropoxide, and aluminum isopropoxide.

According to another embodiment of the present disclosure, a polarizing plate including the anti-reflective film can be provided.

The polarizing plate may include a polarizer and an anti-reflective film formed on at least one surface of the polarizer.

The material and preparation method of the polarizer are not particularly limited, and the material and preparation method commonly known in the art can be used. For example, the polarizer may be a polyvinyl alcohol-based polarizer.

The polarizer and the anti-reflective film can be laminated by an adhesive such as an aqueous adhesive or a non-aqueous adhesive.

According to another embodiment of the present disclosure, a display device including the above-mentioned anti-reflective film can be provided.

A specific example of the display apparatus is not limited, and for example, it may be a device such as a liquid crystal display device, a plasma display device, or an organic light emitting diode display device, and a flexible display device.

In the display device, the anti-reflective film may be provided on the outermost surface of an observer side or a backlight side of the display panel.

In the display device including the anti-reflective film, the anti-reflective film may be located on one surface of the polarizing plate relatively far from the backlight unit, among the pair of polarizing plates.

The display device may include a display panel, a polarizer provided on at least one surface of the panel, and an anti-reflective film provided on the opposite surface making contact the panel of the polarizer.

According to yet another embodiment of the present disclosure, an organic light emitting diode display device including the anti-reflective film can be provided.

Generally, the organic light emitting diode display device has high resolution and high color reproduction capability. In the case of an anti-reflective film having high color values, for examples, a characteristic that the absolute value of b* in the CIE Lab color space is greater than 4, the color reproduction capability of the organic light emitting diode display device may be deteriorated.

On the contrary, the anti-reflective film of the one embodiment can realize high light transmittance and low reflectance, have a colorless and transparent property because the absolute value of b* in the CIE Lab color space has a low color value of 4 or less, and thus can realize the effect of maintaining or increasing the color reproduction capability of the organic light emitting diode display device.

Advantageous Effects

According to the present disclosure, an anti-reflective film that can simultaneously realize high scratch resistance and anti-fouling properties while having high light transmittance, and that has colorless and transparent properties while realizing low reflectance, and a polarizing plate, a display device and an organic light emitting diode display device including the same can be provided.

BRIEF DESCRIPTION OF THE DRAWINGS

FIG. 1 shows the reflectance pattern of the anti-reflective film of Example 1.

FIG. 2 shows the reflectance pattern of the anti-reflective film of Example 2.

FIG. 3 shows the reflectance pattern of the anti-reflective film of Example 3.

FIG. 4 shows the reflectance pattern of the anti-reflective film of Example 4.

FIG. 5 shows the reflectance pattern of the anti-reflective film of Example 5.

FIG. 6 shows the reflectance pattern of the anti-reflective film of Example 6.

FIG. 7 shows the reflectance pattern of the anti-reflective film of Comparative Example 1.

FIG. 8 shows the reflectance pattern of the anti-reflective film of Comparative Example 2.

FIG. 9 shows the reflectance pattern of the anti-reflective film of Comparative Example 3.

FIG. 10 shows the reflectance pattern of the anti-reflection film of Comparative Example 4.

Hereinafter, the present disclosure will be described in more detail in the following examples. However, these examples are given for illustrative purposes only and the content of the present disclosure is not intended to be limited to or by the examples in any way.

PREPARATION EXAMPLES 1 TO 2: PREPARATION OF HARD COATING LAYER

Preparation Example 1: Preparation of Hard Coating Layer HD1

Solid components of 75 g of trimethylolpropane trimethacrylate (TMPTA), 2 g of silica fine particles having an average particle diameter of 20 nm (surface treatment: 3-methacryloyloxypropylmethyldimethoxysilane), 0.05 g of fluorine-based acrylate (RS-537, DIC) and 1.13 g of photoinitiator (Irgacure 184, Ciba) were diluted in a MEK (methyl ethyl ketone) solvent so that a solid content concentration was 40 wt. %, thereby preparing a hard coating composition.

The diluted hard coating solution was coated onto a triacetyl cellulose film using a #10 mayer bar, dried and photocured under the conditions of Table 1 below to prepare a hard coating film having a thickness of 5 µm.

The wind speed applied during drying of the hard coating layer in each of the following Examples and Comparative Examples is shown in Table 2 below.

Preparation Example 2: Preparation of Hard Coating Layer HD2

Solid components of 75 g of trimethylolpropane trimethacrylate (TMPTA), 2 g of silica fine particles having an average particle diameter of 20 nm (surface treatment: 3-methacryloyloxypropylmethyldimethoxysilane), 0.5 g of fluorine-based acrylate (RS-537, DIC) and 1.13 g of photoinitiator (Irgacure 184, Ciba) were diluted in a MEK (methyl ethyl ketone) solvent so that the solid content concentration was 40 wt. %, thereby preparing a hard coating composition.

The diluted hard coating solution was coated onto a triacetyl cellulose film using a #10 mayer bar, dried and photocured under the conditions of Table 1 below to prepare a hard coating film having a thickness of 5 µm.

The wind speed applied during drying of the hard coating layer in each of the following Examples and Comparative Examples is shown in Table 2 below.

TABLE 1

| | Nitrogen purging during photocuring | UV intensity [mJ/cm$^2$] |
| --- | --- | --- |
| Preparation Example 1 | ◯ | 25 mJ/cm$^2$ |
| Preparation Example 2 | ◯ | 254 mJ/cm$^2$ |

PREPARATION EXAMPLES 3 TO 6: PREPARATION OF LOW REFRACTIVE INDEX LAYER COATING COMPOSITION

Preparation Example 3: Preparation of Photocurable Coating Composition for Preparing Low Refractive Index Layer Based on 100 parts by weight of trimethylolpropane trimethacrylate (TMPTA), 281 parts by weight of hollow silica nanoparticles (diameter: about 50 to 60 nm, density: 1.96 g/cm$^3$, manufactured by JSC Catalyst and Chemicals), 63 parts by weight of solid silica nanoparticles (diameter: about 12 nm, density: 2.65 g/cm$^3$, Nissan Chemical), 131 parts by weight of a first fluorine-containing compound (X-71-1203M, Shin-Etsu), 19 parts by weight of a second fluorine-containing compound (RS-537, DIC), and 31 parts by weight of an initiator (Irgacure 127, Ciba) were diluted in a mixed solvent of methyl isobutyl ketone (MIBK):diacetone alcohol (DAA):isopropyl alcohol in a weight ratio of 3:3:4 so that the solid content concentration was 3 wt. %.

Preparation Example 4: Preparation of Photocurable Coating Composition for Preparing Low Refractive Index Layer Based on 100 parts by weight of trimethylolpropane trimethacrylate (TMPTA), 200 parts by weight of hollow silica nanoparticles (diameter: about 50 to 60 nm, density: 1.96 g/cm$^3$, manufactured by JSC Catalyst and Chemicals), 48 parts by weight of solid silica nanoparticles (diameter: about 12 nm, density: 2.65 g/cm$^3$, Nissan Chemical), 111 parts by weight of a first fluorine-containing compound (X-71-1203M, Shin-Etsu), 15 parts by weight of a second fluorine-containing compound (RS-537, DIC), and 21 parts by weight of an initiator (Irgacure 127, Ciba) were diluted in a mixed solvent of methyl isobutyl ketone (MIBK):diacetone alcohol (DAA):isopropyl alcohol in a weight ratio of 3:3:4 so that the solid content concentration was 3 wt. %.

Preparation Example 5: Preparation of Photocurable Coating Composition for Preparing Low Refractive Index Layer Based on 100 parts by weight of trimethylolpropane trimethacrylate (TMPTA), 300 parts by weight of hollow silica nanoparticles (diameter: about 60 to 70 nm, density: 1.79 g/cm$^3$, manufactured by JSC Catalyst and Chemicals), 85 parts by weight of solid silica nanoparticles (diameter: about 12 nm, density: 2.65 g/cm$^3$, Nissan Chemical), 150 parts by weight of a first fluorine-containing compound (X-71-1203M, Shin-Etsu), 33 parts by weight of a second fluorine-containing compound (RS-537, DIC), and 35 parts by weight of an initiator (Irgacure 127, Ciba) were diluted in a mixed solvent of methyl isobutyl ketone (MIBK):diacetone alcohol (DAA):isopropyl alcohol in a weight ratio of 3:3:4 so that the solid content concentration was 3 wt. %.

Preparation Example 6: Preparation of Photocurable Coating Composition for Preparing Low Refractive Index Layer Based on 100 parts by weight of trimethylolpropane trimethacrylate (TMPTA), 248 parts by weight of hollow silica nanoparticles (diameter: about 60 to 60 nm, density: 1.96 g/cm$^3$, manufactured by JSC Catalyst and Chemicals), 68 parts by weight of solid silica nanoparticles (diameter: about 12 nm, density: 2.65 g/cm$^3$, Nissan Chemical), 120 parts by weight of a first fluorine-containing compound (X-71-1203M, Shin-Etsu), 33 parts by weight of a second fluorine-containing compound (RS-537, DIC), and 30 parts by weight of an initiator (Irgacure 127, Ciba) were diluted in a mixed solvent of methyl isobutyl ketone (MIBK):diacetone alcohol (DAA):isopropyl alcohol in a weight ratio of 3:3:4 so that the solid content concentration was 3 wt. %.

Example and Comparative Example: Preparation of Low Refractive Index Layer and Anti-Refractive Film The photocurable coating composition obtained above was coated onto a hard coating layer of Preparation Examples 1 to 2 at a thickness of 120 nm using a #4 mayer bar, dried and cured under the conditions of Table 2 below.

At the time of curing, it proceeded under nitrogen purging, and the drying was performed at a temperature was 90° C. for 1 minute.

TABLE 2

|  | Hard coating | Hard coating layer drying wind speed (m/s) | Low refractive index layer |
|---|---|---|---|
| Example 1 | Preparation Example 1 | 0.5 | Preparation Example 3 |
| Example 2 | Preparation Example 1 | 0.5 | Preparation Example 4 |
| Example 3 | Preparation Example 1 | 1.0 | Preparation Example 4 |
| Example 4 | Preparation Example 1 | 0.5 | Preparation Example 5 |
| Example 5 | Preparation Example 1 | 0.5 | Preparation Example 6 |
| Example 6 | Preparation Example 1 | 1.0 | Preparation Example 6 |
| Comparative Example 1 | Preparation Example 1 | 0.3 | Preparation Example 6 |
| Comparative Example 2 | Preparation Example 2 | 0.3 | Preparation Example 5 |
| Comparative Example 3 | Preparation Example 2 | 0.5 | Preparation Example 5 |
| Comparative Example 4 | Preparation Example 2 | 0.7 | Preparation Example 3 |

Experimental Example: Measurement of Physical Properties of Anti-Reflective FILM The following experiments were performed for the anti-reflective films obtained in Examples and Comparative Examples.

1. Measurement of Surface Energy of Hard Coating Film

The surface energies of the hard coating layers of each of Examples and Comparative Examples were measured by determining a contact angle of DI water (Gebhardt) and diiodomethane (Owens) at 10 points using a contact angle measuring apparatus DSA-100 (Kruss), calculating the average value, and then converting the average contact angle into the surface energy. In the measurement of the surface energy, the contact angle was converted into the surface energy by using Dropshape Analysis software and applying the following Equation 2 of the OWRK (Owen, Wendt, Rable, Kaelble) method to the program.

$$\gamma_L(1+\cos\theta) = 2\sqrt{\gamma_S^D \gamma_L^D} + 2\sqrt{\gamma_S^P \gamma_L^P} \quad \text{[Equation 2]}$$

2. Measurement of Reflectance of Anti-Reflective Film and b* in CIE Lab Color Space For the anti-reflective films obtained in Examples and Comparative Examples, the reflectance and b* at each wavelength in the visible light region (380 to 780 nm) were measured using a Solidspec 3700 (SHIMADZU) equipment. After scanning the specimen from 380 nm to 780 nm and measuring the reflectance at each wavelength, the average reflectance and b* were derived using the UV-2401PC Color Analysis program.

3. Measurement of Anti-Fouling Property

Three straight lines were drawn with a red permanent marker on the surface of the anti-reflective films obtained in Examples and Comparative Examples. Then, the anti-fouling property was evaluated through the number of erasing times when rubbing with a nonwoven cloth.

<Measurement Standard>

○: Erase when rubbing 10 times or less

△: Erase when rubbing 11 to 20 times

X: Erase when rubbing 20 times or more

4. Measurement of Scratch Resistance

The surface of the anti-reflective films obtained in Examples and Comparative Examples was rubbed back and forth 10 times with steel wool (#0000) under a load at a speed of 27 rpm. The scratch resistance was obtained by measuring the maximum load at which a scratch of 1 cm or less observed with the naked eye was 1 or less.

5. Ellipsometry Measurement

For the anti-reflective films each obtained in Examples and Comparative Examples, the polarization ellipticity was measured by an ellipsometry method.

Specifically, the ellipsometry was measured for the anti-reflection films each obtained in Examples and Comparative Examples at an incidence angle of 70° in a wavelength range of 380 nm to 1000 nm using a J. A. Woollam Co. M-2000 apparatus.

The measured ellipsometry data (ψ, λ) was fitted to a Cauchy model of the following Equation 1 for Layer 1 and Layer 2 of the lower refractive index layer using Complete EASE software.

$$n(\lambda) = A + \frac{B}{\lambda^2} + \frac{C}{\lambda^4} \quad \text{[Equation 1]}$$

in the above Equation 1, n(λ) is a refractive index at a wavelength λ, λ is in a range of 300 nm to 1800 nm, and A, B, and C are Cauchy parameters.

In addition, for the mixed layer of the low refractive index layer, the refractive index and thickness were fitted to a diffuse layer model. MSE of The Cauchy model and the diffuse layer model was set to be 5 or less.

6. Measurement of Refractive Index

For the mixed particle layer included in the low refractive index layer obtained in Examples, the refractive indexes at wavelengths of 550 nm and 400 nm were calculated using a polarization ellipticity measured at a wavelength of 380 nm to 1,000 nm, a Cauchy model, and a diffuse layer model.

as to divide the regions in which the hollow inorganic nanoparticles and the solid inorganic nanoparticles are mainly distributed while including the mixed layer in the low refractive index layer, and thus the anti-reflective films realizes high scratch resistance and excellent anti-fouling properties, and at the same time, the absolute value of b* in the CIE Lab color space has a low color value of 4 or less, which can have colorless and transparent properties.

On the contrary, as shown in Table 4, in the anti-reflective films of Comparative Examples, it appears that regions where the hollow inorganic nanoparticles and the solid inorganic nanoparticles are mainly distributed are divided,

TABLE 3

|  | Example 1 | Example 2 | Example 3 | Example 4 | Example 5 | Example 6 |
| --- | --- | --- | --- | --- | --- | --- |
| Average reflectance (%) | 0.9 | 1.35 | 1.42 | 0.6 | 1.1 | 1.2 |
| b value in CIE Lab color space | 3.3 | 2.9 | 1.2 | 1.5 | 2.5 | 2.1 |
| Surface energy of hard coating layer [mN/m] | 35 | 35 | 35 | 35 | 35 | 35 |
| Position of the particle-mixed layer from the hard coating layer (nm) | 32 | 45 | 40 | 31 | 51 | 16 |
| Thickness of the particle-mixed layer (nm) | 2.5 | 11.1 | 12.9 | 8.62 | 5.8 | 18.1 |
| Reflectance of anti-reflective film at a wavelength of 550 nm | 0.8093 | 1.1233 | 1.3193 | 0.598 | 0.9895 | 1.121 |
| Reflectance of anti-reflective film at a wavelength of 400 nm | 1.3768 | 2.5755 | 2.3928 | 1.299 | 1.7627 | 1.5946 |
| Ratio of reflectance at wavelength 400 nm to reflectance at wavelength 550 nm | 1.70 | 2.29 | 1.81 | 2.17 | 1.78 | 1.42 |
| Scratch resistance (g) | 500 | 500 | 500 | 500 | 500 | 500 |
| Anti-fouling | ○ | ○ | ○ | ○ | ○ | ○ |
| Phase separation | ○ | ○ | ○ | ○ | ○ | ○ |

TABLE 4

|  | Comparative Example 1 | Comparative Example 2 | Comparative Example 3 | Comparative Example 4 |
| --- | --- | --- | --- | --- |
| Average reflectance (%) | 0.92 | 0.7 | 0.75 | 0.84 |
| b value in CIE Lab color space | 4.2 | 5.1 | 4.5 | −7.73 |
| Surface energy of hard coating layer [mN/m] | 33 | 32 | 33 | 34 |
| Position of the particle-mixed layer from the hard coating layer (nm) | 11 | 10 | 65 | 13.4 |
| Thickness of the particle-mixed layer (nm) | 22.12 | 25.98 | 31.58 | 1.31 |
| Reflectance of anti-reflective film at a wavelength of 550 nm | 0.875 | 0.5877 | 0.6521 | 0.78 |
| Reflectance of anti-reflective film at a wavelength of 400 nm | 2.3886 | 1.9539 | 1.9844 | 2.55 |
| Ratio of reflectance at wavelength 400 nm to reflectance at wavelength 550 nm | 2.73 | 3.32 | 3.04 | 3.27 |
| Scratch resistance (g) | 150 | 50 | 200 | 100 |
| Anti-fouling | X | X | X | X |
| Phase separation | X | X | X | X |

As shown in Table 3, it was confirmed that the anti-refractive films of Examples, in which a particle-mixed layer containing both hollow inorganic nanoparticles and solid inorganic nanoparticles and having a thickness of 1.5 nm to 22 nm exists in the low refractive index layer, realize a reflectance of 1.5% or less at a wavelength of 550 nm, and also the ratio of the reflectance at a wavelength of 400 nm to the reflectance at a wavelength of 550 nm is 1.3 to 2.7.

Further, from the results of Table 3, it was confirmed that the anti-reflective films of Examples are phase-separated so and thus not unevenly distributed (phase separated), confirming that scratch resistance or anti-fouling properties are not sufficient.

In addition, from the results of Table 4, it appears that a particle-mixed layer having a thickness of more than 22 nm exists in the low refractive index layer of the anti-reflective films of Comparative Examples, or the particle-mixed layer is located excessively close to or too far from the hard coating layer, and it was confirmed that in the anti-reflective films of these Comparative Examples, the ratio of the reflectance at a wavelength of 400 nm to the reflectance at a wavelength of 550 nm exceeds 2.7, the films show a blue color and have an opacity or color property to a degree that is not suitable for application to a polarizing plate or a display device.

What is claimed is:

1. An anti-reflective film comprising:
a hard coating layer; and a low refractive index layer,
wherein a particle-mixed layer containing both hollow inorganic nanoparticles and solid inorganic nanoparticles and having a thickness of 1.5 nm to 22 nm exists in the low refractive index layer, and
wherein the anti-reflective film has a ratio of the reflectance at a wavelength of 400 nm to the reflectance at a wavelength of 550 nm of 1.3 to 2.7.

2. The anti-reflective film according to claim 1,
wherein the anti-reflective film has a reflectance of more than 0.5% and 1.5% or less at a wavelength of 550 nm.

3. The anti-reflective film according to claim 1,
wherein the anti-reflective film has a reflectance of 1.0% to 3.5% at a wavelength of 400 nm.

4. The anti-reflective film according to claim 1,
wherein the particle-mixed layer has a thickness of 2.0 nm to 20 nm.

5. The anti-reflective film according to claim 1,
wherein the thickness of the particle-mixed layer is determined by fitting a polarization ellipticity measured by an ellipsometry method to a diffusion layer model.

6. The anti-reflective film according to claim 1,
wherein the low refractive index layer is formed on one surface of the hard coating layer, and
the particle-mixed layer is located at a distance of 15 nm to 60 nm from the one surface of the hard coating layer.

7. The anti-reflective film according to claim 6,
wherein a region between the one surface of the hard coating layer and the particle-mixed layer has a refractive index of 1.46 to 1.65 at a wavelength of 550 nm.

8. The anti-reflective film according to claim 1,
wherein the low refractive index layer has a thickness of 20 nm to 240 nm.

9. The anti-reflective film according to claim 1,
wherein the hard coating layer has a surface energy of more than 34 mN/m.

10. The anti-reflective film according to claim 1,
wherein the low refractive index layer is formed on one surface of the hard coating layer,
the low refractive index layer comprises hollow inorganic nanoparticles and solid inorganic nanoparticles dispersed in a binder resin, and
50% by volume or more of the entire solid inorganic nanoparticles in the low refractive index layer exist between the one surface of the hard coating layer and the particle-mixed layer.

11. The anti-reflective film according to claim 10,
wherein in the low refractive index layer, 50% by volume or more of the entire hollow inorganic nanoparticles exist in a region from the particle-mixed layer to one surface of the low refractive index layer opposite from the hard coating layer.

12. The anti-reflective film according to claim 11,
wherein the region from the particle-mixed layer to one surface of the low refractive index layer opposite from the hard coating layer has a refractive index of 1.0 to 1.40 at a wavelength of 550 nm.

13. The anti-reflective film according to claim 1,
wherein the solid inorganic nanoparticles have a diameter of 0.5 to 100 nm, and
the hollow inorganic nanoparticles have a diameter of 1 to 200 nm.

14. The anti-reflective film according to claim 1,
wherein a difference in density between the solid inorganic nanoparticles and the hollow inorganic nanoparticles is 0.50 $g/cm^3$ to 3.00 $g/cm^3$.

15. The anti-reflective film according to claim 1,
wherein the low refractive index layer comprises a binder resin, and hollow inorganic nanoparticles and solid inorganic nanoparticles dispersed in the binder resin, and
the binder resin included in the low refractive index layer comprises a crosslinked (co) polymer between a (co) polymer of a photopolymerizable compound and a fluorine-containing compound including a photoreactive functional group.

16. The anti-reflective film according to claim 1,
wherein the hard coating layer comprises a binder resin including a photocurable resin, and organic or inorganic fine particles dispersed in the binder resin.

17. A polarizing plate comprising the anti-reflective film of claim 1 and a polarizer.

18. A display device comprising the anti-reflective film of claim 1.

19. An organic light emitting diode display device comprising the anti-reflective film of claim 1.

* * * * *